(12) United States Patent
Villwock et al.

(10) Patent No.: US 8,587,250 B2
(45) Date of Patent: Nov. 19, 2013

(54) APPARATUS AND METHOD FOR ROTATING-SENSOR-LESS IDENTIFICATION OF MAGNETO-MECHANICAL PARAMETERS OF AN AC SYNCHRONOUS MOTOR

(75) Inventors: Sebastian Villwock, Pechbrunn (DE); Heiko Zatocil, Nuremberg (DE)

(73) Assignee: Baumuller Nurnberg GmbH, Nuremberg (DE)

( * ) Notice: Subject to any disclaimer, the term of this patent is extended or adjusted under 35 U.S.C. 154(b) by 212 days.

(21) Appl. No.: 13/205,712

(22) Filed: Aug. 9, 2011

(65) Prior Publication Data

US 2012/0038299 A1 Feb. 16, 2012

(30) Foreign Application Priority Data

Aug. 16, 2010 (EP) .................................... 10172908

(51) Int. Cl.
*H02P 21/00* (2006.01)

(52) U.S. Cl.
USPC . 318/806; 318/798; 318/400.32; 318/400.33; 318/400.15; 318/400.01; 318/700

(58) Field of Classification Search
USPC .............. 318/700, 400.01, 400.41, 805–809, 318/811, 713, 798, 599, 400.32, 400.33, 318/400.15
See application file for complete search history.

(56) References Cited

U.S. PATENT DOCUMENTS

| | | | | |
|---|---|---|---|---|
| 4,112,339 A | * | 9/1978 | Lipo ............................. | 318/798 |
| 4,724,373 A | * | 2/1988 | Lipo ............................. | 318/805 |
| 5,510,689 A | * | 4/1996 | Lipo et al. ..................... | 318/809 |
| 5,559,419 A | * | 9/1996 | Jansen et al. .................. | 318/808 |
| 5,625,264 A | * | 4/1997 | Yoon ........................ | 318/400.06 |
| 5,959,431 A | * | 9/1999 | Xiang ........................... | 318/811 |

(Continued)

FOREIGN PATENT DOCUMENTS

| | | |
|---|---|---|
| EP | 1 758 239 A2 | 2/2007 |
| JP | 2010 041839 A | 2/2010 |

OTHER PUBLICATIONS

Villwock, Sebastian; Baumuller, Andreas; Pacas, Mario; Gotz, Fritz-Rainer; Liu, Biao, Barinberg, Viktor, Influence of the Power Density Spectrum of the Excitation Signal on the Identification of Drives, Industrial Electronics, 2008, 34th Annual Conference of IEEE, Piscataway, NJ, USA pp. 1252-1257.

(Continued)

*Primary Examiner* — Rita Leykin
(74) *Attorney, Agent, or Firm* — Frank H. Foster; Kremblas & Foster

(57) ABSTRACT

A method for the identification without a shaft encoder of magnetomechanical characteristic quantities, in particular the mass moment of inertia J and the permanent magnetic flux $\psi_{PM}$ between rotor and stator of a three-phase synchronous motor, comprising:—constant voltage supply $U_{1d}$ in the d flux axial direction;—test signal voltage supply $U_{1q}$ in the q transverse flux axial direction;—measuring signal current measuring $I_{1q}$ of the q transverse flux axial direction;—identification of magnetomechanical characteristic quantities of the synchronous motor on the basis of the test signal voltage $U_{1q}$ and of the measuring signal current $I_{1q}$; whereby the rotor can execute deflection movements with pre-definable maximal amplitudes. Method use also for control of electrical drives. An identification apparatus for determination of magnetomechanical characteristic quantities (79) of a synchronous motor (09) that also relates to a motor control device, whereby the identified characteristic quantities can be used for the determination, optimization and monitoring of a motor control.

15 Claims, 11 Drawing Sheets

(56) References Cited

U.S. PATENT DOCUMENTS

| | | | |
|---|---|---|---|
| 6,005,364 A * | 12/1999 | Acarnley | 318/632 |
| 6,768,280 B2 * | 7/2004 | Kitajima | 318/432 |
| 7,066,034 B2 * | 6/2006 | Ying Yin Ho | 73/862.193 |
| 7,117,754 B2 * | 10/2006 | Neely et al. | 73/862.333 |
| 7,180,263 B2 * | 2/2007 | Maeda et al. | 318/719 |
| 7,299,708 B2 * | 11/2007 | Ho | 73/862.193 |
| 7,710,066 B2 * | 5/2010 | Hashimoto et al. | 318/807 |
| 8,319,464 B2 * | 11/2012 | Hsu | 318/400.41 |

OTHER PUBLICATIONS

Khalil, H.S.; Eman, S.A.; Kandil, S.A., Identification of Synchronous Machine Models Using Power Spectral Analysis, Conference on Edinburgh, UK, London, Jan. 1991, pp. 92-97.

* cited by examiner

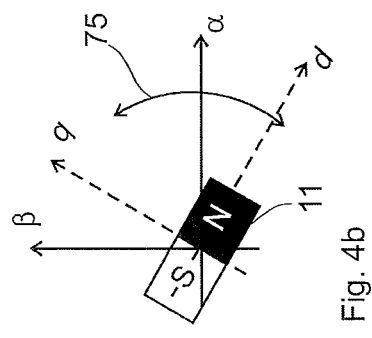
Fig. 3
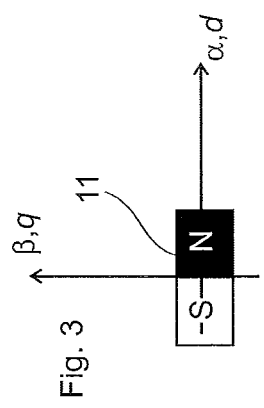
Fig. 4a
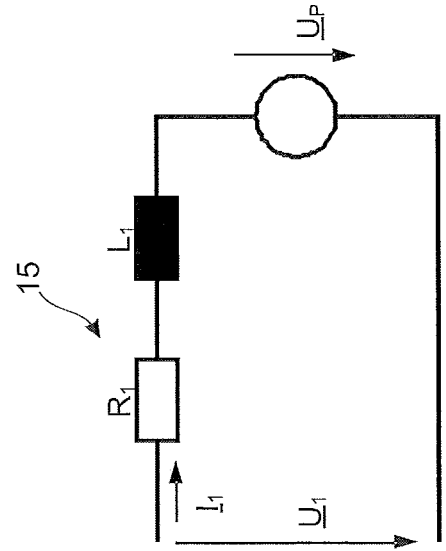
Fig. 4b
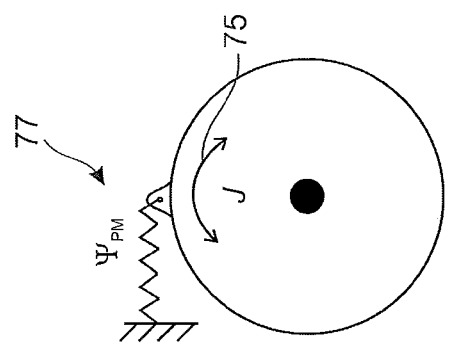
Fig. 4c
Fig. 4d

APPARATUS AND METHOD FOR ROTATING-SENSOR-LESS IDENTIFICATION OF MAGNETO-MECHANICAL PARAMETERS OF AN AC SYNCHRONOUS MOTOR

The present invention starts from a method, a device, an apparatus and the use of a method for an identification of magnetomechanical characteristic quantities, in particular the mass moment of inertia J of the rotor and permanent magnetic flux $\psi_{PM}$ between rotor and stator of a three-phase synchronous motor. Magnetomechanical characteristic quantities make possible the characterization of a three-phase motor relative to the magnetic interaction between stator and rotor and make possible mechanical dynamic behaviors, so that both the magnetic as well as the mechanical and rotational behaviors of the motor can be characterized during operation.

STATE OF THE ART

Various methods are known from the state of the art for determining the magnetic and the mechanical behavior of a three-phase motor. As a rule sensor data from position transmitters, angle of rotation transmitters or engine speed sensors are evaluated for the determination of the mechanical behavior, and the mass moment of inertia J of the rotor: $J=\int r^2 \rho(\vec{r})dV$ with $\rho(\vec{r})$ of the mass density in the volume V with distance r from the axis of the rotor is determined taking into account mechanical structural data of the three-phase motor. However, modern electrical drives regulated without a shaft encoder can not fall back on sensor data, so that mechanical characteristic quantities can not be determined in normal operation.

The inertia of masses J indicates the resistance of the rotor upon a change of its rotational state and therefore describes the rotational dynamic of the motor. The torque M can be calculated from it by $M=\dot{\omega}J=\alpha J$. In order to determine the magnetic flux $\psi_{PM}$ between stator and rotor, magnetic field sensors, for example, Hall sensors, AMR sensors or the like can be used in order to measure the magnitude of the magnetic flux density B. The magnitude of the magnetic flux supplies information about the maximal torque that can be achieved and that results from the Lorentz force $\vec{F} = I \cdot \vec{l} \times \vec{B}$.

A three-phase synchronous motor comprises a stator with at least three stator coils and rotor with a permanent magnetization that is either produced by permanent magnets or is generated by coils through which direct current flows and which are provided with brushes. For a simplified characterization of the electrical behavior of a synchronous motor an equivalent circuit like the one shown in FIG. 4d is typically used in which the stator coil is simulated by an ohmic resistor $R_1$ and an inductivity $L_1$ as well as by a voltage source $U_p$ for taking account of the induced voltage. A knowledge of electrical magnitudes can be advantageous for determining magnetomechanical magnitudes.

In a three-phase system in a Y or Δ circuit the current results by feeding two phases according to the rule $I_u+I_v+I_w=0$ with lacking star point grounding. For this reason a three-phase system can also be described with two coordinates, whereby in order to describe the total current a coordinate system can be considered in the complex plane in which the two coordinates real part and imaginary part can be designated as α and β coordinates as regards the stationary alignment of the stator windings according to FIG. 1. The α/β coordinate system describes, for example, the direction of the current flux or the rotor flux axis in the resting reference system of the stator of the three-phase motor. As regards the rotor, a second rotating coordinate system can be introduced whose axes are designated as the d axis and the q axis of the rotor, as is shown in FIG. 2. The d axis designates the main direction of the magnetic flux of the rotor and the q axis designates the transverse flux axis at a right angle to it. An alignment of the stator magnetic field in the direction of the d axis of the rotor brings about quasi the determination of the rotor, whereas the stator magnetic field alignment in the direction of the q axis of the rotor brings about a torque on the rotor. A transformation of α/β stator coordinate system into the rotating d/q rotor coordinate system can be brought about via the angle of rotation $\beta_k$ between the winding axis of the phase U of the stator and between the longitudinal axis of the rotor magnetic field. In this regard a total motor current I or its three-phase currents $I_u$, $I_v$ and $I_w$ can be considered in the stator-fixed α/β coordinate system or in the d/q coordinate system rotating with the rotor. As regards the conversion of the phase currents of the three-phase synchronous motor into the α/β coordinate system, the following relationship applies:

$$\begin{pmatrix} i_\alpha \\ i_\beta \end{pmatrix} = \begin{pmatrix} 1 & 0 & 0 \\ 0 & \frac{\sqrt{3}}{3} & -\frac{\sqrt{3}}{3} \end{pmatrix} \begin{pmatrix} i_u \\ i_v \\ i_w \end{pmatrix}, \begin{pmatrix} i_u \\ i_v \\ i_w \end{pmatrix} = \begin{pmatrix} 1 & 0 \\ -\frac{1}{2} & \frac{\sqrt{3}}{2} \\ -\frac{1}{2} & -\frac{\sqrt{3}}{2} \end{pmatrix} \begin{pmatrix} i_\alpha \\ i_\beta \end{pmatrix}.$$

that can be modified by taking into account the rotor angle $\beta_k$ for the d/q coordinate system. For the following mathematical detection of the relationships a consideration is carried out in the α/β stator coordinate system according to FIG. 2, whereby the equivalent circuit shown in FIG. 4d describes a single-phase equivalent circuit characterization of the three-phase synchronous machine with feed voltages- and currents $U_1$, $I_1$ as well as $U_2$, $I_2$.

FIG. 4d shows the equivalent circuit of a synchronous motor with reference to an α/β vector diagram, whereby, given knowledge of the cited equivalent circuit magnitudes, the electrical operating behavior of the three-phase motor can be characterized in different operating instances:

$$U_{1\alpha} = R_1 I_{1\alpha} + L_1 \frac{dI_{1\alpha}}{dt} + U_P \sin(\beta_K) = R_1 I_{1\alpha} + L_1 \frac{dI_{1\alpha}}{dt} \underbrace{-\Omega_K \Psi_{PM}}_{U_P} \sin(\beta_K)$$

$$U_{1\beta} = R_1 I_{1\beta} + L_1 \frac{dI_{1\beta}}{dt} - U_P \cos(\beta_K) = R_1 I_{1\beta} + L_1 \frac{dI_{1\beta}}{dt} + \underbrace{\Omega_K \Psi_{PM}}_{-U_P} \cos(\beta_K)$$

with $\beta_K = \int \Omega_K(t) dt = \Omega_K t.$

The two differential equations represent a PT1 behavior in the frequency range with the induction term $U_p$ as excitation source, which term for its part is a function of the speed and thus of the mechanical behavior of the motor. The admittance of the motor in the operating behavior can be determined by measuring electrical magnitudes, which admittance results in accordance with the following equation:

$$G_{\alpha/\beta}(j\omega) = Y_{\alpha/\beta}(j\omega) = \frac{I_{1\alpha/\beta}(j\omega)}{U_{1\alpha/\beta}(j\omega)}$$

Starting from the phase voltages $U_U$, $U_V$ and $U_W$ and phase currents $I_u$, $I_v$ and $I_w$, they are transformed in accordance with the above transformation into the co d/q ordinate system. Thus, the electrical behavior of the three-phase synchronous machine can be considered with the aid of the input magnitude $U_1$ and output magnitude $I_1$. In this regard, separate ways of consideration can be carried out as regards the α and β- and the d-q-axis, so that, for example, as regards the d axis a transmission function or admittance results with:

$$G_1 = I_{1d}/U_{1d}.$$

By determining the transmission function $G_1$, unknown parameters of the transmission function can be determined. There are, for example, considerations for determining the electrical equivalent circuit magnitudes $L_1$, $R_1$ by a similar start assuming a rotor standstill (n=0->$U_p$=0).

The use of a pseudo-noise binary signal (PRBS) as electrical test activation is known from the state of the art for determining mechanical characteristics of a three-phase motor, in particular for diagnosing the errors of mechanical parts or for mechanical system identification during operation in a mechanical connection. The mechanical system constitutes an SISO system here (Single-Input Single-Output) in which a single mechanical output magnitude can be measured by a mechanical shaft encoder with the aid of a single mechanical or electrical input magnitude. The input magnitude is excited with the aid of the pseudo-noise binary signal so that a broadband behavior of the SISO can be determined in the output magnitude. Characteristics of the mechanical system can be derived with the aid of theoretical signal methods of frequency transformation and parameter identification using the frequency behavior given knowledge of the basic system equation.

However, in the case of a determination of magnetomechanical characteristic quantities based on the supply and measuring of purely electrical magnitudes a so-called MIMO system (Multiple-Input Multiple-Output) is involved in which several input magnitudes (phase voltages) must be fed in several output magnitudes (these currents) must be extracted. For this reason the methods known from the process for the identification of mechanical magnitudes cannot be used for the electrical system characterization of a three-phase motor. The identification of the mechanical system is comprehensively described in the dissertation of Sebastian Villwock "Identifikationsmethoden für die automatisierte Inbetriebnahme and Zustandsüberwachung elektrischer Antriebe" [German—"Identification Methods for the Automated Starting and Status Monitoring of Electrical Drives", University of Siegen, 2007, (publication [1]). Furthermore, a theoretical signal method for the parameter identification of the mechanical system which method is used in this regard is described in the journal contribution: S. Villwock, J. M. Pacas: "Application of the Welch-Method for the Identification of Two and Three Mass Systems", IEEE Transactions on Industrial Electronics, Vol. 55, No. 1, January 2008, pp. 457-466 (publication [2]). A method which is generically similar was presented in the framework of a conference article in: P. Szczupak, J. M. Pacas: "Automatic Identification of a PMSM Drive Equipped with an Output LC-Filter", IEEE Industrial Electronics, IECON 2006, $32^{nd}$ Annual Conference on November 2006, pp. 1143-1148 (publication [3]), The present invention has the problem, starting from an electrical equivalent circuit of a three-phase synchronous machine, of suggesting a method for determining magnetomechanical characteristic quantities, in particular of the mass moment of inertia J of the rotor and of the drive line and of the permanent magnetic flux $\psi_{PM}$ between rotor and stator, whereby a parameter identification is made possible without shaft encoder sensors, the rotor executes only slight deflection movements with pre-definable maximal amplitudes and the magnetomechanical characteristic quantities can be determined by a single measurement. Advantageous further developments of the invention are subject matter of the subclaims.

A further problem of the invention consists in suggesting an apparatus for the identification without shaft encoder in which the identification of the magnetomechanical characteristic quantities can be carried out only by measuring electrical magnitudes, so that no sensors have to be used to determine the magnetic or mechanical behavior of the synchronous machine with connected drive line.

DISCLOSURE OF THE INVENTION

In a first aspect of the invention a method is suggested for the identification of magnetomechanical characteristic quantities without shaft encoder, in particular the mass moment of inertia J of the rotor or of the drive line and the permanent magnetic flux $\psi_{PM}$ between the rotor and the stator of a three-phase synchronous motor. The method comprises at least the steps:

Constant voltage infeed $U_{1d}$ in d-direction of axial flux of the rotor by impressing a direct current $I_{1d}=I_{DC}$;

Test signal voltage infeed $U_{1q}$ in q-transverse axial direction of the rotor, whereby the d-direction of axial flux remains with DC current;

Measurement of measuring signal current $I_{1q}$ of the q-transverse axial direction;

Identification of magnetic mechanical characteristic quantities of the synchronous motor based on the test signal voltage $U_{1q}$ and on the measuring signal current $I_{1q}$;

whereby the supplying of a test signal into the synchronous motor takes place in such a manner that the rotor can execute deflection movements with pre-definable maximal amplitudes based on the supplying of test signals.

The supplying of test signals and measuring a measuring signals takes place by the supplying of stator voltage and the measuring of stator currents in the U/V/W system. However, the voltages are carried out regarding a known position of the d main magnetic flux axis of the rotor. The direction of the d axis can be determined and/or defined, for example, by a mechanical stop, by a sensor of angular rotation or by a purposeful alignment or search of the rest position of the rotor in comparison to the α/β axes of the stator. The resulting frequency response data contains the information about at least the mechanical characteristic quantity J (mass moment of inertia) and magnetic characteristic quantity $\psi_{PM}$ (permanent flux), whereby the method of the invention makes possible the identification of the mass moment of inertia J and of the magnetic permanent flux $\psi_{PM}$ for a synchronous motor, in particular for a synchronous motor excited by a permanent magnet (PMSM), solely on the basis of the electrical magnitudes voltage and current. The method takes into account both the mass moment of inertia J of the motor as well as of a possibly mechanically coupled drive line, for example, transmissions and moved machine parts of a connected machine.

A movement of deflection with pre-definable maximal amplitudes of the rotor means that the angle of the rotor opposite the stator changes only in a pre-determinable angular extent, so that no complete rotation of the rotor can take place and the rotor remains aligned in a definable angular area relative to the stator. The maximal amplitudes should only be so large that the simplification can be assumed that the rotor stands still, as a result of which the d/q axial system can be stationarily viewed opposite the α/β axial system. After the assuming of a standstill position of the rotor a test signal voltage is fed in the direction of the q flux axis of the rotor and the resulting measured signal current $I_{1q}$ is measured. A constant current impressing $I_{1d}$ in the d axial direction brings about an alignment of the rotor opposite the stator, whereby no torque is exerted on the rotor. The rotor forms a spring-mass system, as shown in FIG. 4, whereby the magnetic field fed in the d direction brings about a return and the current fed in the q direction brings about an excitation of the system. The mass corresponds to the moment of inertia of the rotor and/or of the drive line. The mechanical drive line consists of the rotor of the electrical drive machine and of an optionally coupled, mechanical load including transmissions, shafts and the like. The structure of the test signal $U_{1q}$ determines which frequency components or frequency areas can be measured and with which precision the equivalent circuit parameters can be identified, whereby characteristic quantities can be extracted in accordance with the frequency cover of the test signal. A supplying of the test signal $U_{1q}$ generates a measured signal current $I_{1q}$ that can be measured. Additional measuring technology is not required since the given theoretical voltages can be generated in the form of the test signal, for example, in a controller or signal processor (DSP) of a motor-controlling inverter apparatus and the currents for the current control can be measured in any case, although a mechanical magnitude is identified here.

In contrast to an asynchronous motor, given an identical supplying of a test signal in both rotor axis directions d and q, an uncontrollable torque formation would occur and therefore an uncontrolled mechanical movement of the motor shaft. In order to avoid this, at first a rest position search or alignment of the d axis opposite the α/β axes of the stator can be carried out in order that the position of the d flux axis is known. In distinction to the asynchronous machine the measuring of the frequency response takes place subsequently by supplying the test signal exclusively in the q direction, since the q component of the stator $I_{1q}$, contributes to the torque formation. The rest position search can be avoided in that the supplying of the machine with current takes place in the α direction with a direct current. Then, the rotor aligns itself on the α axis so that the α axis and the d axis coincide. Thus, the test signal can be supplied via the α axis, that now coincides with the d axis, into the three-phase motor. As a result, the rotor can be quasi-determined in the d axial direction, whereby the constant supplying of current in the d direction causes a return action, so that a supplying of test signal in the q direction does make rotor movements possible; however, a return into a definable rotor position is given by the return action. Alternatively, if the rest position alias pole position of the synchronous machine is known a priori, the test signal can be supplied directly as voltage $U_{1q}$ and the constant voltage $U_{1d}$ in a suitable manner into the stator windings.

The supplying of the phase voltage for measuring the phase current can take place, for example, by a ⅔ phase converter that can generate, following the above matrix relation and taking into account the rotor angle of rotation $\beta_k$, the three phase voltages $U_u$, $U_v$ and $U_w$ from the two voltages $U_{1d}$ and $U_{1q}$ and can transform the two currents $I_{1d}$ and $I_{1q}$ from the three measured currents $I_u$, $I_v$ and $I_w$. A supplying of the test signal can take place, for example, by a controlling of an inverter of the motor control apparatus of the three-phase motor. Alternatively, the test signal voltage can be supplied directly into the phases of the synchronous machine in accordance with the position of the d axis. The measuring of the phase currents can take place via the same current measuring instruments that are used in a regulation without a shaft encoder in the operation of the three-phase motor. The supplied test signal voltages and the measured measuring signal currents can be recorded as digitally detected scanned values in time in the time range and the characteristic quantities can be extracted on their basis. This preferably takes place by a frequency range analysis, i.e., a frequency transformation of the recorded time-range data, and an analysis of the frequency response of the measured transmission function $G_1$. Given knowledge of the above-cited admittance function, that can be represented as a transmission function in the frequency range, the coefficients and therewith the individual parameters of the transmission function can be determined by a suitable theoretical signal method, whereby these parameters can be used to identify the magnetomechanical characteristic quantities.

A determination of the frequency response of the transmission function G with knowledge of the admittance formula $\overline{Y}$ forming the base makes possible the extraction of the magnetomechanical characteristic quantities. Thus, statements about the magnetic and mechanical characteristic quantities of the three-phase motor can be made by feeding in an especially broadband test signal with a single measurement. For this, theoretical signal methods are used that transform the measured time area data into frequency range data, whereby the frequency response can be detected with formulas and the parameters of the basic transmission function and therewith the equivalent circuit magnitudes can be identified by a parameter extraction from the frequency response.

Basically, instead of a set test voltage and a measuring current determination, a setting of test current with detection of the measured voltage can take place. However, in particular powerful motors have a highly inductive behavior so that in order to impress rectangular current switching impulses high driver voltages must be applied, as a result of which an impressing of test current is only possible with great expense.

According to an advantageous further development of the invention, given knowledge of the position of the d/q rotor axis directions opposite the α/β stator axial directions, an appropriate $U_{1\alpha}$, $U_{1\beta}$ supply takes place, so that a constant stator magnetic field can be carried out in the d direction of axial flux and a test signal feed can be carried out in the q direction of axial flux. The rotor position angle $\beta_k$ is known from a knowledge of the position of the d rotor axis to the α stator axis, so that a constant voltage as well as a torque-forming measuring voltage can be impressed on the stator winding in order to put the rotor in a purposeful manner into measuring oscillations about the rotor position angle $\beta_k$.

The d direction of axial flux of the rotor can be aligned in an especially advantageous manner opposite the α axis of the stator, so that the rotor position angle $\beta_k=0$. By supplying a constant voltage $U_{1\alpha}$, in the α axial direction of the stator, an alignment of the d flux axis of the rotor relative to the α axis of the stator can be brought about by impressing a direct current $I_{1\alpha}=I_{DC}$; and a supply of test signal voltage $U_{1\beta}$ can take place in the β axial direction, whereby the α axial direction remains supplied with DC current so that a measuring signal current measuring $I_{1\beta}$ of the β axial direction can be measured. A constant supplying of current in the α axial direction therefore brings about an alignment of the d direction of axial flux, whereby the rotor remains torque-free. If the rotor rest position, i.e., $\beta_k$ is known, for example, by a defined mechanical stop or position information by a rotary angle sensor, then a constant supplying with current of the stator windings can take place in the positional direction of the d rotor axis. Also, a constant supplying of the stator coils with current in any desired position can force an alignment of the d axis into the axis of the stator magnetic field being adjusted.

A method for the rest position search has already been implemented in many motor control apparatuses known from the state of the art.

In the case of an alignment from the d to the α axis the simplifications presented in formulas in the following result, so that the magnetomechanical characteristic quantities can be identified in an especially simple manner. The machine is oriented in the axis of flux (d axis) by supplying a constant voltage $U_{1\alpha}$=constant, e.g., 10 V, whereby the shaft of the machine may move. The α axis now corresponds to the d axis and the β axis now corresponds to the q axis. This constant supplying must be maintained during the entire identification procedure, i.e., even while the test signal is being supplied, as will be explained in the following. Thus, a spring-like effect can be produced. The stable position of the rotor is disturbed with the supplying of a suitable $U_{1\beta}$ test signal into the β axis, i.e. the q axis in this case, and a deflection occurs and therewith a torque. The constant current $I_{1\alpha}$ counteracts this and will want to draw the rotor into the axis of flux again.

The following model equations apply here:
Voltage equations in the stator-fixed reference system:

$$U_{1\alpha} = R_1 I_{1\alpha} - \Omega_K \Psi_{PM} \cdot \sin(\beta_K) + L_1 \cdot \frac{dI_{1\alpha}}{dt}$$

$$U_{1\beta} = R_1 I_{1\beta} + \Omega_K \Psi_{PM} \cdot \cos(\beta_K) + L_1 \cdot \frac{dI_{1\beta}}{dt}, \text{ mit } \beta_K = \Omega_K \cdot t$$

By supplying $U_{1\alpha}$=constant, α axis=d axis for small deflections:

$$\to \beta_K \approx 0,$$

$$\to \sin(\beta_K) \approx \beta_K \text{ and } \cos(\beta_K) \approx 1.$$

The voltage equations result therewith for $$U_{1\alpha} = R_1 I_{1\alpha} - \Omega_K \Psi_{PM} \cdot \beta_K + L_1 \cdot \frac{dI_{1\alpha}}{dt}$$

is $$U_{1\beta} = R_1 I_{1\beta} + \Omega_K \Psi_{PM} \cdot 1 + L_1 \cdot \frac{dI_{1\beta}}{dt}$$

Exception=$I_{1\alpha}$ constant yields:

$$U_{1\alpha} = R_1 I_{1\alpha} - \Omega_K \Psi_{PM} \cdot \beta_K$$

$$U_{1\beta} = R_1 I_{1\beta} + \Omega_K \Psi_{PM} + L_1 \cdot \frac{dI_{1\beta}}{dt}.$$

The derivation of the relation between rotor angle $\beta_k$ and measuring signal current $I_{1c}$, now follows: The block diagram shown in FIG. 9 forms the starting point for the consideration: The input magnitude of the block diagram is the torque-forming component of the stator current $I_{1q}$. The output magnitude is the angle $\beta_k$ of the flux linkage of the permanent magnets in the α/β coordinate system $\beta_k$ fixed in the stand, whereby p signifies the pole pair number.

The relation $$K_T = \frac{3}{2} p \Psi_{PM}$$

applies for the torque constant $K_T$.

Therefore, $$\beta_K = K_T \frac{1}{sJ} I_{1q} \frac{1}{s} p$$

is valid.

In addition, in the flux-fixed coordinate system the following applies $$I_{1q} = I_{1\beta} \cos(\beta_K) - I_{1\alpha} \sin(\beta_K)$$

$$\to \beta_K = \frac{K_T p}{s^2 J}[I_{1\beta} \cos(\beta_K) - I_{1\alpha} \sin(\beta_K)].$$

For small $\beta_k$ the following simplification follows:

$$\beta_K = \frac{K_T p}{s^2 J}[I_{1\beta} - I_{1\alpha} \beta_K]$$

$$\to \beta_K = \frac{K_T p I_{1\beta}}{s^2 J + K_T p I_{1\alpha}}.$$

With $$\Omega_k = \frac{d\beta_k}{dt}$$

or $\Omega_K = s\beta_K$ the following is obtained:

$$\Omega_K = \frac{K_T p I_{1\beta} s}{s^2 J + k_T p I_\alpha}.$$

The following now results for the β voltage equation:

$$U_{1\beta} = R_1 I_{1\beta} + \Psi_{PM} \cdot \frac{K_T p I_{1\beta} s}{s^2 J + K_T p I_{1\alpha}} + L_1 \cdot I_{1\beta} \cdot s = \left[R_1 + \Psi_{PM} \cdot \frac{K_T p s}{s^2 J + K_T p I_{1\alpha}} + L_1 \cdot s\right] \cdot I_{1\beta}$$

The following transmission function is obtained:

$$G_\beta(s) = \frac{I_{1\beta}(s)}{U_{1\beta}(s)} = \frac{s^2 J + K_T p I_{1\alpha}}{s^3 J L_1 + s^2 J R_1 + s(L_1 K_T p I_{1\alpha} + \Psi_{PM} K_T p) + R_1 K_T p I_{1\alpha}}$$

This transmission function contains only 2 unknowns, the magnetomechanical characteristic quantities J, $\psi_{PM}$, that are to be determined in the framework of this identification, whereby the inertia is contained in the term $K_T$. The transmission function can be written in the form:

$$G_\beta(s) = \frac{I_{1\beta}(s)}{U_{1\beta}(s)} = \frac{a_2 s^2 + a_0}{b_3 s_1^3 + b_2 s^2 + b_1 s + b_0}.$$

The above transmission function can be formed by division by transformation of the supplied test signal $U_{1b}$ and of the measured measuring signal current $I_{1\beta}$ into the Laplace range and the coefficients $a_0$, $a_2$, $b_0$, $b_1$ and $b_2$ determined by customary identification processes.

The parameters inertia J of the mechanical system as well as permanent magnetic flux $\psi_{PM}$ can be determined from the latter, given the knowledge that $a_0=K_T p I_{1\alpha}$, $a_2=J$, $b_0=R_1 K_T p I_{1\alpha}$, $b_1=L_1 K_T p I_{1\alpha}+\psi_{PM} K_T p$, $b_2=JL_1$.

According to an advantageous further development the ratio of constant voltage $U_{1d}$ to test signal voltage $U_{1q}$ can be selected in such an optimal manner for achieving maximal amplitudes of the deflection movement at a height such that magnetomechanical characteristic quantities of an adjustable spring-mass system can be determined with a pre-determinable accuracy. During the supplying of the test signal into the d rotor coordinate direction no torque is produced in the machine, so that the rotor remains at first torque-free in its position. The constant voltage $U_{1d}$ is to be selected in a magnitude here such that the rotor can return "elastically" into its position of rest during the supplying of the test signal in q direction. A constant voltage that is too low would lead to an undesired rotation of the rotor opposite the stator, so that no purposeful d/q current supply could be carried out. A constant voltage that is too high compared to the test signal voltage $U_{1q}$ would lead to a stopping of the stator, so that no mechanical movement and therefore no self-induction would occur. Consequently, in both instances no mechanical characteristic quantities could be determined. Therefore, it is important that the amplitudes of the constant voltage and of the test signal are in an appropriate relationship. If the constant voltage in the d axis would be clearly too large, the effect would be like a mechanically stopped machine. The method described here is based on the fact that the machine can move out of the flux axis and independently return into it. To this end it can advantageously be conceivable to vary the ratio of constant voltage $U_{1d}$ to the test signal voltage $U_{1q}$ and/or to vary the height of the constant voltage $U_{1d}$ and to perform parameter identifications with changed voltage values, whereby the resulting parameters can be determined as average or weighted parameters from the results of the individual parameter identifications. Thus, errors can be reduced in the determination, so that a more precise result can be achieved.

According to an advantageous further development further characteristic quantities, in particular equivalent circuit characteristic quantities $L_1$, $R_1$ as well as mechanical structural magnitudes such as pole pair number p and/or electrical measuring magnitudes such as $I_{1\alpha}$, $I_{1\beta}$, in particular $I_{1\alpha}=I_{DC}$ of the synchronous motor can be taken into account or also identified for the identification of the magnetomechanical characteristic quantities. In accordance with the above formula relationships, in order to determine the inertia and the permanent magnetic flux $\psi_{PM}$ the knowledge of pole pair number p, equivalent circuit parameters $L_1$, $R_1$ as well as the magnitude of the stopping current $I_{1\alpha}$ are required. These values can be structurally defined, empirically fixed or detected with measuring technology. For a detection in particular of the equivalent circuit parameters $L_1$, $R_1$ with measuring technology a related parameter identification of the electrical equivalent circuit parameters based on a purposeful test signal supply offers itself that is subject matter of a parallel patent application and in which a test signal is supplied in the d direction, whereby the q direction remains without current. In addition, the characteristic quantities or equivalent circuit parameters that are characterized in the coefficients of the transmission function can also be determined in the framework of the parameter identification. Thus, it is conceivable to extract all parameters, at least in any case the electrical equivalent circuit parameters, flowing into the transmission function from the determined coefficients of the transmission function.

According to an advantageous further development the test signal can be a pseudo-noise binary signal. The test signal should have a high bandwidth in order to make possible the highest possible frequency resolution of the electrical motor behavior. White noise has a uniformly distributed broadband frequency spectrum. A pseudo-noise binary signal (PRBS) is a binary signal that approximates the spectrum of white noise. It can typically assume the values +1 and −1 and is used alternatively to white noise. In particular, the reproducibility of the signal is advantageous, whereby a PRB signal is frequently used in regulating technology for the analysis of an impulse response by means of a maximum length sequence. A PRB test signal can be readily generated by linear feedback shift registers and can be generated, for example, by a DSP (Digital Signal Processor), FPGA (Field Programmable Gate Array) or microcontrollers of a motor regulator for controlling the inverter. Thus, every motor control electronic system can generate such a PRB signal without great modification and feed it in as motor voltage into the motor.

Basically, a frequency range transformation of scanned time range data can take place as desired for the identification of the equivalent circuit parameters in the frequency range. According to an advantageous further development of the invention the identification of the equivalent circuit parameters can comprise a Fourier transformation in accordance with a periodogram method, preferably a Bartlett method, in particular a Welch method. A spectral power density is achieved in the framework of a periodogram method by a Fourier transformation of individual data blocks. The quality of the spectral estimation can be improved in that a number of periodograms that are independent of each other are averaged. This method is known in the literature under the name of Bartlett method, in which the measured signal is divided into sections. The Welch method represents an expansion of the procedure suggested by Bartlett. Certain window functions can be used here to reduce the leakage effect. The disturbing leakage effect occurs when the signal section is not periodic, a whole multiple of the period or when this signal section is on the edges of zero. The use of a Welch method in the identification of a system of two or of three units is already known from the above-cited publication [2]. The Welch method splits M scanning values into K partial sequences that are weighted with a window function and is applied to a Fourier transformation. The Welch method described in the publication [1] makes possible the transformation of any number of scanning values with the greatest possible accuracy into the frequency range. The time range data is windowed here, the windowed data divided into partial sequences and Fourier-transformed and periodograms are determined from this that can be used to determine the transmission function, in this instance the admittance function, in the frequency range.

However, alternatively to the above, a correlogram method, also known in the literature under the name Blackman-Tukey estimation, can be used. Here, the spectral estimation takes place on the basis of an autocorrelation function (AKF) and a cross correlation function (KKF) that is calculated from the test signal (excitation signal) and from the measured signal (response signal). In this formulation the spectral power density is obtained by Fourier transformation of the previously estimated AKF and KKF. However, the Welch method furnishes more robust results.

Starting from the presentation of a known transmission function present in the frequency range, for example, of the admittance course, the equivalent circuit parameters of the three-phase motor can be extracted. There have already been a few numeric attempts to this end. The Levenberg-Marquardt algorithm can be used with particular advantage in a further development of the invention in order to identify at first the transmission function coefficients $a_0$, $a_2$, $b_0$, $b_1$ and $b_2$, the parameters forming the base for the latter, and building on this, the magnetomechanical characteristic quantities. Alternatively, for example, a method according to Nelder and Mead can be used whereby, however, the Levenberg-Marquardt algorithm furnishes more robust results, in particular in the case of data records with a lot of noise. It belongs to the group of gradient methods, whereby better parameter vectors corresponding to the coefficients of the transmission function can be calculated by iterative minimizing of an error function. The Levenberg-Marquardt method is considered at the present as the standard method for non-linear optimizations. It is a mixture of gradient methods and inversion of a Hesse matrix and is also designated in the literature as the method with steepest descent. The inversion of the Hesse matrix is also designated as the Gauss-Newton method. A detailed presentation of the use of the Levenberg-Marquardt algorithm is presented in publication [1], whereby starting from a transmission function:

$$G = \underline{Y} = \frac{a_2 s^2 + a_0}{b_3 s_1^3 + b_2 s^2 + b_1 s + b_0}$$

and with a pattern of the frequency response of the system, the unknown coefficients $a_0$, $a_1$, $b_0$, $b_1$ and $b_2$ can be determined. In comparison to the above-cited admittance presentation, these coefficients correspond to the electrical and magnetomechanical parameters:

$a_0 = K_T p I_{1\alpha}$, $a_2 = J$, $b_0 = R_1 K_T p I_{1\alpha}$, $b_1 = L_1 K_T p I_{1\alpha} + \psi_{PM} K_T p$, $b_2 = J L_1$.

Therefore, the characteristic quantities of the inertia J and of the permanent magnetic flux $\psi_{PM}$ can be determined by the determination of these parameters.

According to an advantageous further development of the invention the identified characteristic quantities can be used in an adjustment and/or optimization of inverter control parameters at least for motor monitoring. In the regulating of modern synchronous machines motor control apparatuses are used that can control the inverter accordingly given rapid speed changes or when making available dynamically regulatable output energy based on the knowledge of the electrical equivalent circuit parameters, and can set the phase drive voltages in such a manner that the machine can optimally meet the desired work tasks without overshootings. In this connection the concepts control and regulation are used synonymously. The knowledge of the magnetic and mechanical characteristic quantities of the drive stretch can consequently serve for the parameterization of the current regulator, whose requirement for a high dynamic range is the greatest as the innermost regulator. In particular, demanding regulating methods that go beyond those of conventional PI regulators require a very precise knowledge of the characteristic quantities of the machine, in particular of the inertia and magnetic flux. In particular state space regulators, dead-beat regulators or model sequence regulators are to be cited here. Since in particular sensorless motor controls are being used in recent times, the magnetic and mechanical characteristic quantities of three-phase motors that are already integrated or replaced in the mechanical drive line in a complex machine environment can be determined by means of the suggested method without shaft encoder and the motor regulator can be adjusted on site. The magnetic and mechanical characteristic quantities have an effect on the electrical behavior, so that in particular during the regulation of complex transient transition processes of the machine a precise controlling of the inverter becomes possible. A regulator adjustment free of overshootings and an optimized rapid dynamic regulation of the motor becomes possible here. In particular, the use of such an optimized motor regulation is conceivable given precise knowledge of the mechanical and magnetic characteristic quantities in the area of printing machines, machines for producing and working plastic surfaces or of roller and packaging machines in which dynamic-optimized motor control methods must be used. In particular in the case of four-color printing machines the slightest deviations in the color printing are recognizable in motor control inaccuracies. In the production of extremely smooth and thin plastic surfaces a uniform thickness of the plastic layer can only be achieved with optimal regulation of the dynamic range, whereby no optical impurities of the plastic material can occur. During the analysis of the magnetic and mechanical characteristic quantities the rotor moves only to a slight extent and can therefore only be identified by electrical current/voltage measurements in the assembled state with only slight influence on the output line. A regulator parameterization serves to optimize the control parameters of the inverter, whereby a deviation of the characteristic quantities from, for example, previous measurements can be taken into account for the error monitoring of the motor or for controlling wear. In particular, the use of the method in the framework of a condition monitoring of the motor can be advantageous, so that from time to time the method can re-determine the characteristic quantities, adaptively adapt the rotor regulator and can emit an error signal in the case of noticeable deviations from previously identified or presettable characteristic quantity values, so that the motor or control electronics can be checked.

A coordinate aspect of the invention relates to an identification device for the identification of magnetomechanical characteristic quantities without a shaft encoder, in particular mass moment of inertia J of the rotor and permanent magnet flux $\psi_{PM}$ between rotor and stator of a three-phase synchronous motor suitable for carrying out a method according to one of the previously cited exemplary embodiments. The identification device comprises an inverter interface unit that can be connected to an inverter control device for the controlling communication and for the determination of the rotor position. It furthermore comprises a test signal generation apparatus for generating a d/q test signal, a U/V/W transformation unit for the transformation of the d/q test signal into a U/V/W control test signal, comprises a d/q transformation unit for transforming measured U/V/W measured signal currents into d/q measured signal currents and comprises a parameter identification unit for the identification of the magnetomechanical characteristic quantities.

Thus, this invention relates to an identification apparatus that is designed for performing a previously cited method and opens up the possibility to this end of communicating by an inverter interface unit with an inverter control apparatus, in particular with the semiconductor components of the inverter, in order to switch them or to query their operating state. An alignment of the d rotor main magnetic flux axis opposite the $\alpha$ stator axis can be performed by directed control of the inverter as well as a test signal supply in the q rotor transverse field axis can be carried out. For example, speed sensors or shaft encoder sensors can furnish information here about an alignment of the rotor and, if necessary, about a rotor angle $\beta_k$ of the d axis opposite the $\alpha$ axis. However, these sensors are not required for parameter identification, a heuristic knowledge about an assumed rotor standstill can suffice in most instances. The identification device comprises a device for generating test signals that can generate a q test signal, whereby the test signal, in particular a PRB noise signal, can be converted by a U/V/W transformation unit as a function of the rotor angle $\beta_k$ into a corresponding U/V/W control test signal that can be supplied to the inverter control apparatus. In the motor the control test signal generates corresponding test signal voltages in the three motor phases. Furthermore, the identification apparatus comprises an d/q transformation unit that can convert the measured $I_U$, $I_v$, and $I_w$ measured signal currents into d/q measured signal currents $I_d$ and $I_q$ and comprises a parameter identification unit that, starting from the test signal voltage $U_q$ present in the time range and from the measured signal current $I_q$ can carry out a parameter identification according to previously cited methods. Such an identification apparatus can be constructed, in a multipartite manner, whereby the motor controller of a motor control apparatus can be used to generate the test signal. The measured current can also be recorded by the motor control apparatus. An external computer can read out these measured and supplied voltages and currents, transform them into the frequency range and carry out a parameter identification.

According to an advantageous further development of the identification apparatus the parameter identification unit can comprise a Fourier transformation means, in particular an FFT/DFT means for the Fourier transformation of discontinuous d/q scanning signal values according to the Welch method and comprise a parameter determination means, in particular a Levenberg-Marquardt transmission function-parameter determination means. Accordingly, the parameter identification unit comprises a Fourier transformation means for transferring the supplied and measured voltage- and current time scan values $U_{1q}$, $I_{1q}$ and comprises a parameter determination means that, starting from the transformation function G present in the frequency range, can carry out a determination of the transformation function coefficients $a_0$, $a_2$, $b_0$, $b_1$ and $b_2$ and as a result can perform the basis system parameters. The computer processes necessary for this can be performed, for example, in a DSP, a microcontroller of an FPGA, in a PC or a small computer, whereby a logical and structural separation between test signal generation, measured value storage, Fourier transformation and parameter determination is possible. The signal processing and the subsequent numeric process can advantageously be provided as software implementation at least partially on a motor regulator or motor control apparatus.

Thus, it is conceivable to build the Fourier transformation means up as FPGA in order to realize a rapid Fourier transformation with the aid of a static switching circuit, and to implement the parameter identification means as variable calculating software on a high-performance DSP of a motor control regulator. A test signal production and measured value storage can be carried out in an inverter motor control device. Fourier transformation and parameter identification can also take place by a motor control device or by an external identification apparatus that comprises an interface to the communication with the motor control device. Thus, the motor control device can be provided with low calculating power, and demanding theoretical signal tasks can be processed in an external identification apparatus that can be connected to the motor control device, as a result of which hardware expense can be saved.

According to an advantageous further development the apparatus can furthermore comprise a monitoring and optimization unit that is set up to determine, optimize and/or monitor control parameters of an inverter control apparatus on the basis of the identified magnetomechanical characteristic quantities. The monitoring and optimization unit receives the Identified characteristic quantities of the parameter identification unit and can optimize control parameters of the motor control device on the basis of the determined magnetomechanical characteristic quantities, in particular as regards a dynamic regulator behavior and/or filter properties in order to reduce the effects of the inductive behavior of the asynchronous motor on the mains. Furthermore, an efficient operation of the motor control can be optimized and motor changes monitored and/or an error signal can be emitted in the case of a motor failure or erroneous behavior.

The magnetomechanical characteristic quantities required for this can be routinely carried out after a certain time interval or, for example, when replacing the motor or motor parts again in the framework of a conditioning monitoring by the monitoring and optimizing unit.

In a coordinate aspect the invention suggests a motor control device for the shaft-encoderless control or regulation of a three-phase synchronous motor that comprises a previously described identification apparatus for the shaft-encoderless identification of magnetic and mechanical characteristic quantities, whereby the identified characteristic quantities can be used for the determination, optimization and monitoring of the motor and/or of the motor control. Thus, this aspect suggests a motor control device or motor regulating device that can perform in a customary manner a sensor-based or shaft-encoderless control or regulation of the speed behavior of the synchronous motor and that comprises an identification apparatus or communicates with such an identification apparatus, and that uses the magnetic and mechanical characteristic quantities for the optimization of the regulating behavior, for the determination of electrical magnitudes for the control of the motor and for the monitoring of an error-free behavior of the synchronous motor and/or of the motor control. Thus, the determined characteristic quantities can serve for the optimal adjustment of control characteristics so that a dynamic regulatory behavior can become possible without overshootings. Thus, the identified characteristic quantities can be used for the optimization of the current consumption and of the energy efficiency of the synchronous motor and be used, for example, for a filter parameterization for adjusting electronic filters, or they can be used for monitoring the error-free behavior of the motor control device and/or of the synchronous motor. In the case of a predeterminable deviation of the identified characteristic quantities in contrast to previously determined or given magnetic and mechanical characteristic quantities an instance of an error can be assumed or a new determination of the characteristic quantities carried out. In the case of a repair order the replacement of the motor the motor control device can adaptively identify the characteristic quantities of the new motor and adjust itself in an optimal fashion to the new motor. A self-calibration of the motor control device can take place in the workplace or during the assembly of the machine at the customer's or in the running operation in the framework of a condition monitoring.

An advantageous further development suggests that the motor control device is arranged in such a manner that an automated identification of the characteristic quantities during about a rotor standstill can be carried out at least during the first startup, preferably several times in the course of the service life, whereby an error signal can be initiated upon a demonstrable deviation of the identified characteristic quantities from previously determined, stored and/or model-related characteristic quantities. Thus, this aspect suggests that a parameter identification is carried out at least upon a first-time startup or upon a test run in the workplace but preferably in the framework of a condition monitoring or during a repair or exchange of parts of the motor, whereby the motor control device can take the identified magnetic and mechanical characteristic quantities into consideration for optimization, adjustment and monitoring of the motor. Thus, a "universal" motor control device can be created that can adapt itself in an adaptive manner to an entire series of different asynchronous motors, whereby an identification of the electrical magnitudes can be performed in the motor standstill. Changes in the motor that are conditioned by age can be taken into account by an adaptive correction of the regulator parameters and erroneous functions of the motor or of the monitoring of the motor control can be recognized.

Finally, a coordinate aspect of the invention suggests a usage of the previously cited method for the determination, optimization and monitoring of motor regulating parameters for the control and/or regulation of electrical drives, in particular for the adjusting of regulating parameters of a motor control device or motor regulating device. It is suggested in this aspect that the determined characteristic quantities are used for regulation optimization, parameterization and monitoring. A determination of the magnetic and mechanical characteristic quantities can be carried out, for example, for a construction series of synchronous motors once on a pattern motor and corresponding regulating parameters can be optimized and adapted for the motor control devices used for this purpose. This can take place in the workshop. If an identification apparatus is provided or can be externally connected in a motor control device, this device can perform a new identification of the characteristic quantities in the assembled state of the motor upon the first startup, during repair measures or in routine or running monitoring of the status (condition monitoring). To this end parts of the method such as the frequency range transformation and the determination of parameters can be carried out on an external computer and other parts such as, for example, the supplying of the test signal and the conversion of the three-phase system into the two coordinate system are carried out in the motor control device. However, it is decisive that the identified characteristic quantities can be used for the optimal regulator parameterization, filter adjustment and electrical dimensioning of structural parts.

DRAWINGS

Further advantages result from the following description of the drawings. Exemplary embodiments of the present invention are shown in the drawings. The drawings, specification and the claims contain numerous features in combination. The person skilled in the art will consider the features even individually in a purposeful manner and combine them to logical further combinations.

The figures show by way of example:

Figure 5:
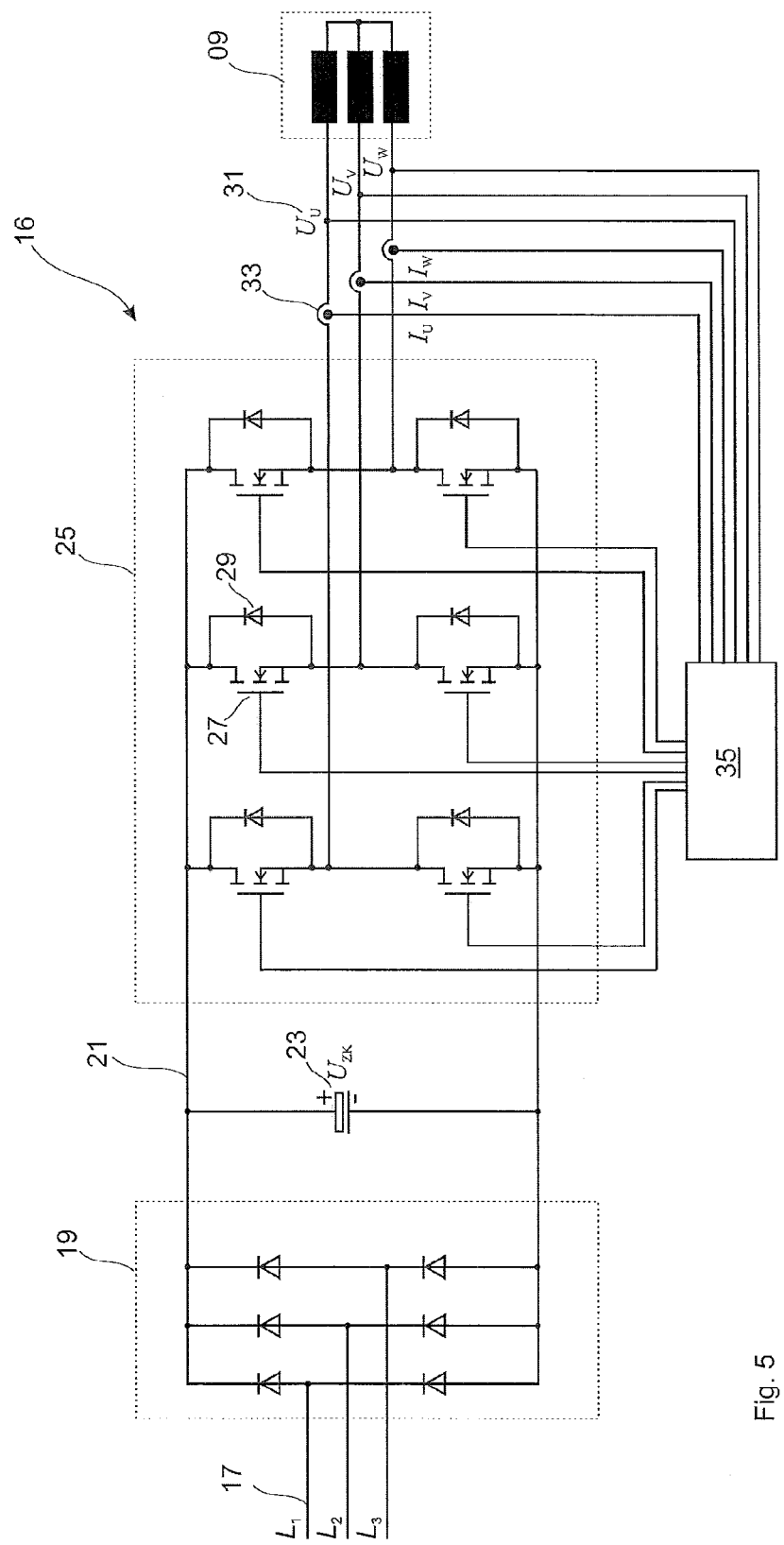
Figure 6:
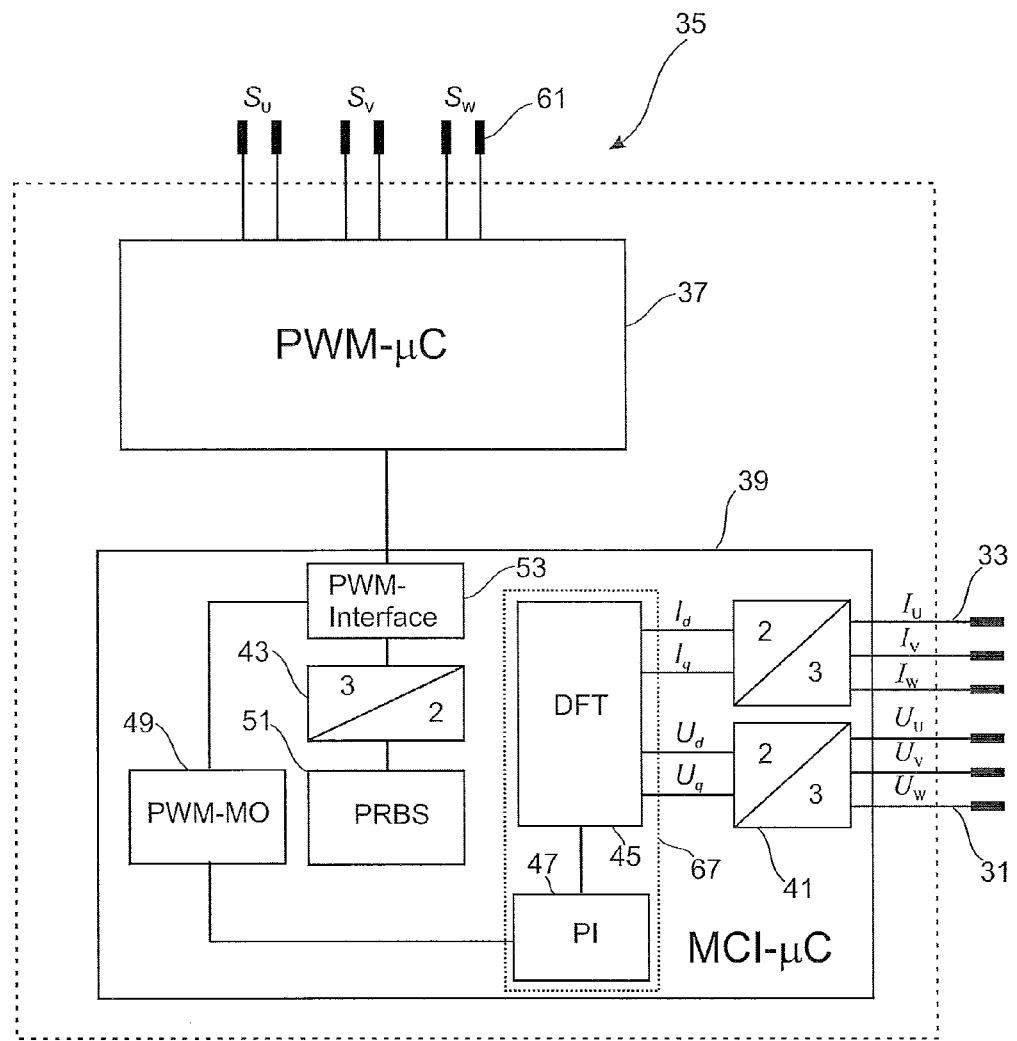
Figure 7:
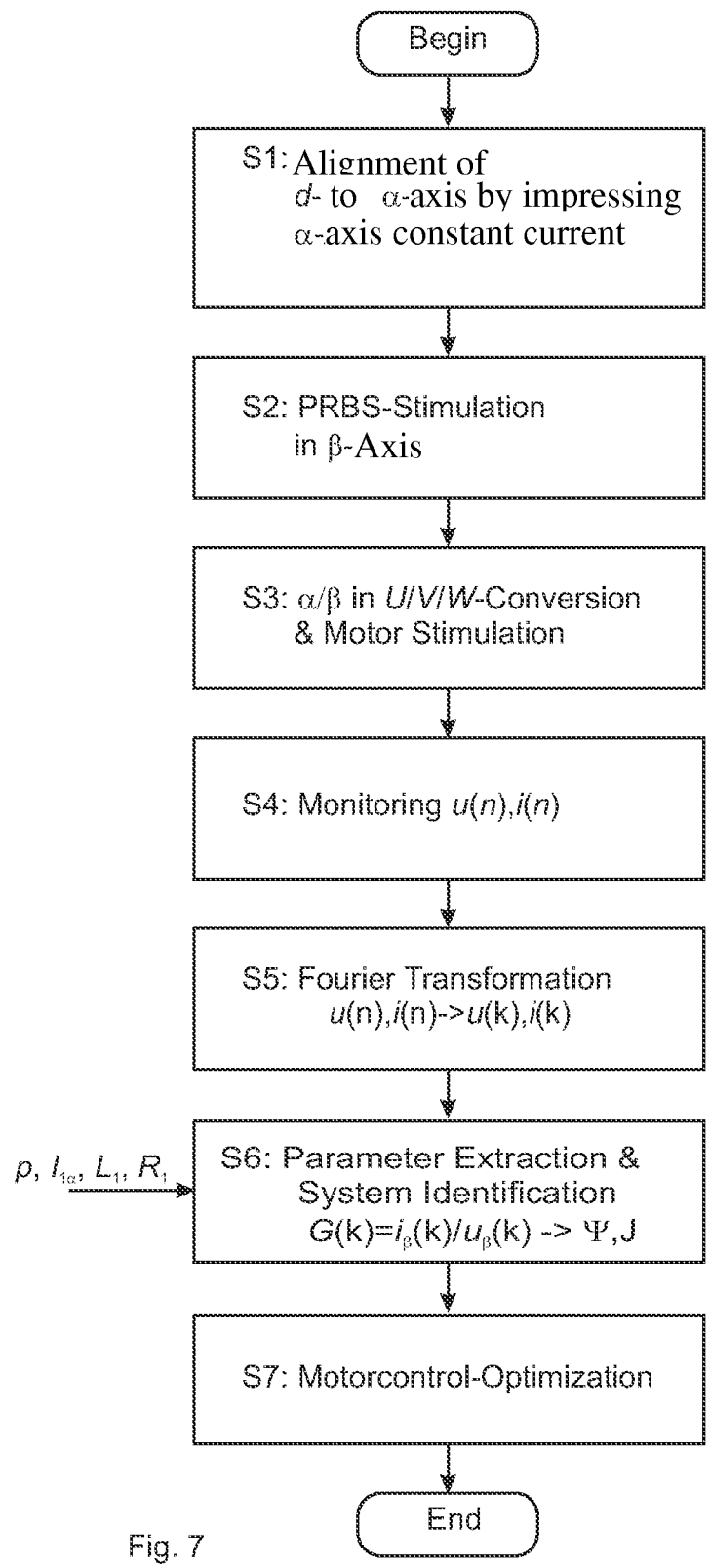
Figure 8:
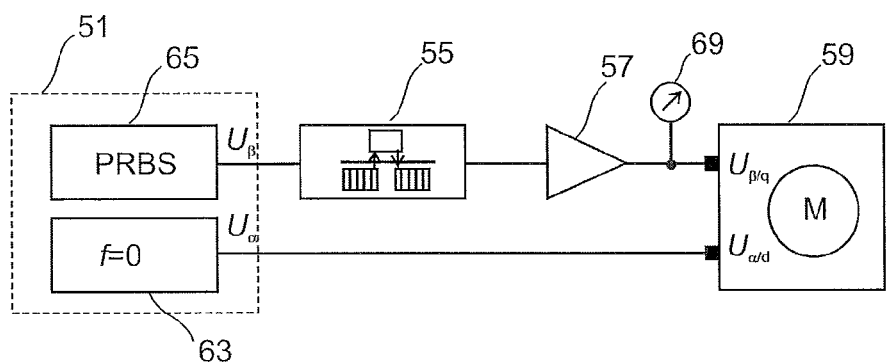
Figure 9:
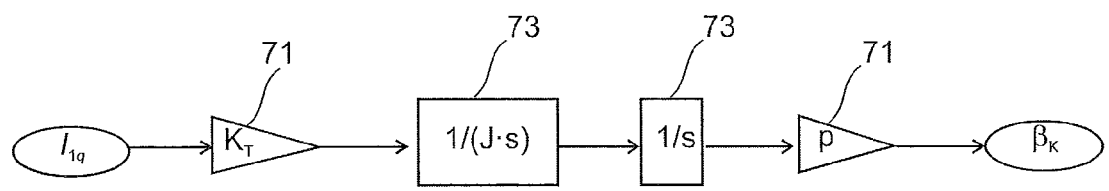
Figure 10A:
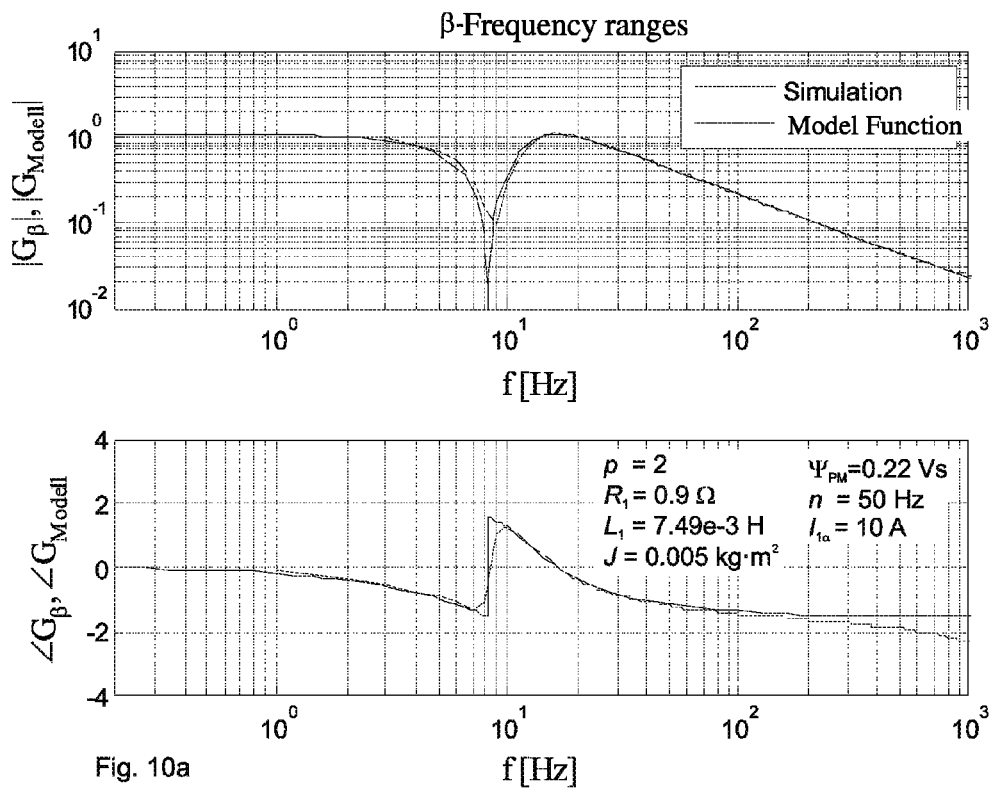
Figure 10B:
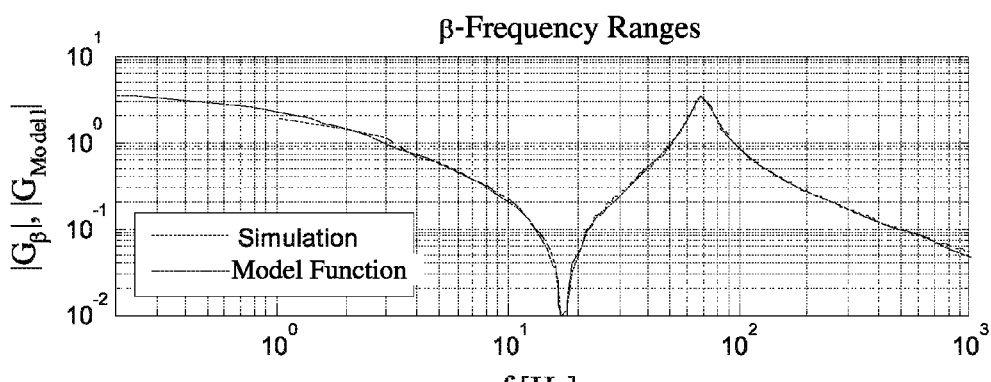
Figure 10B:
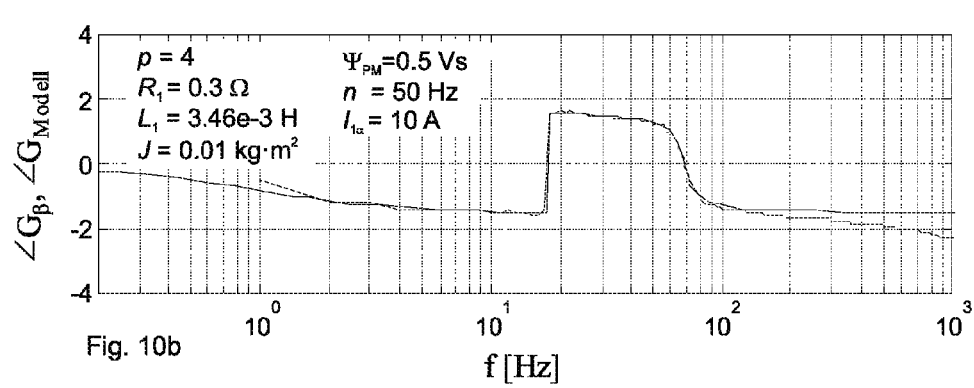
Figure 10C:
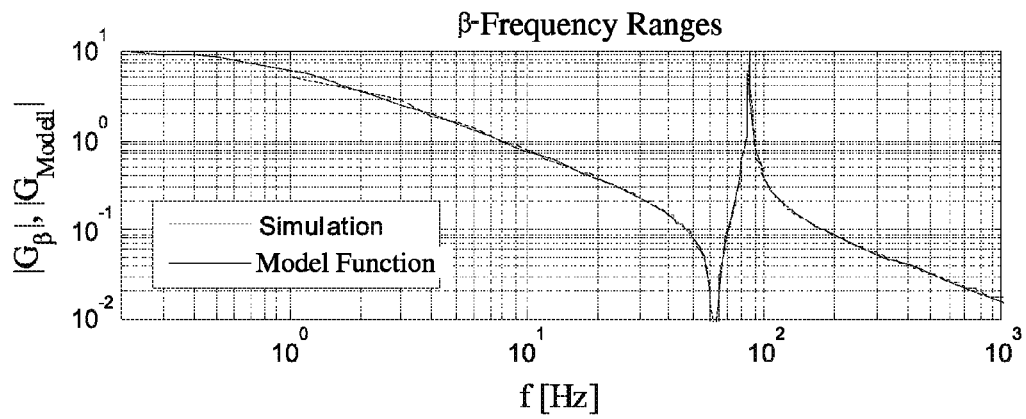
Figure 10C:
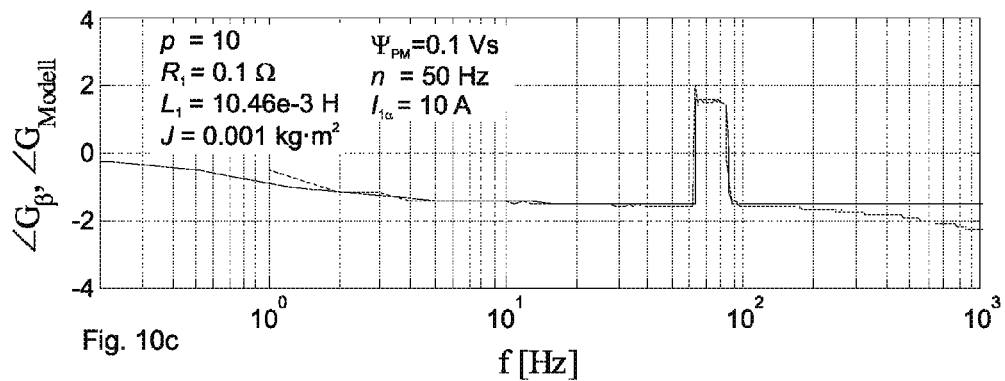
Figure 10D:
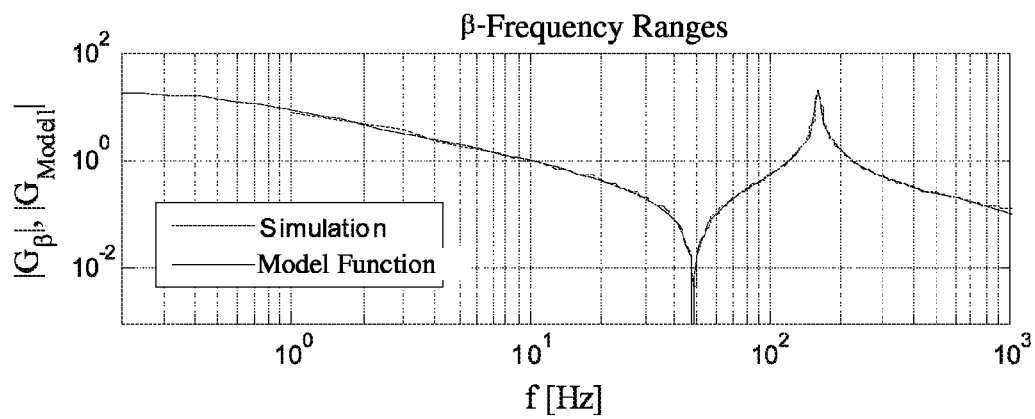
Figure 10D:
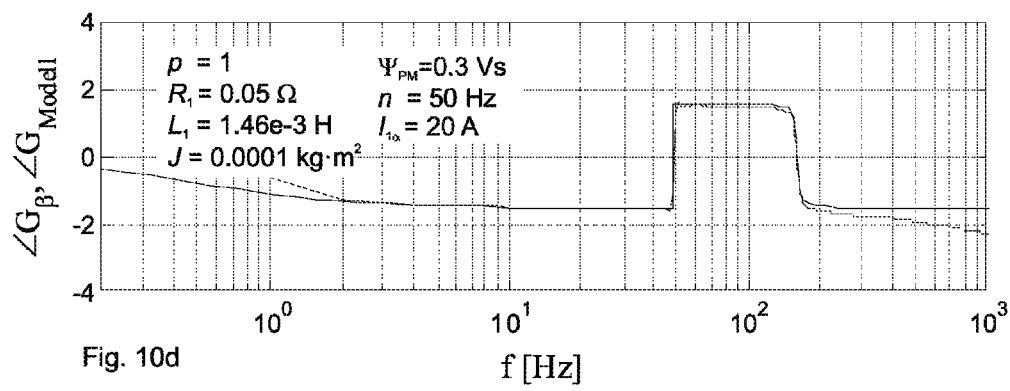
Figure 10E:
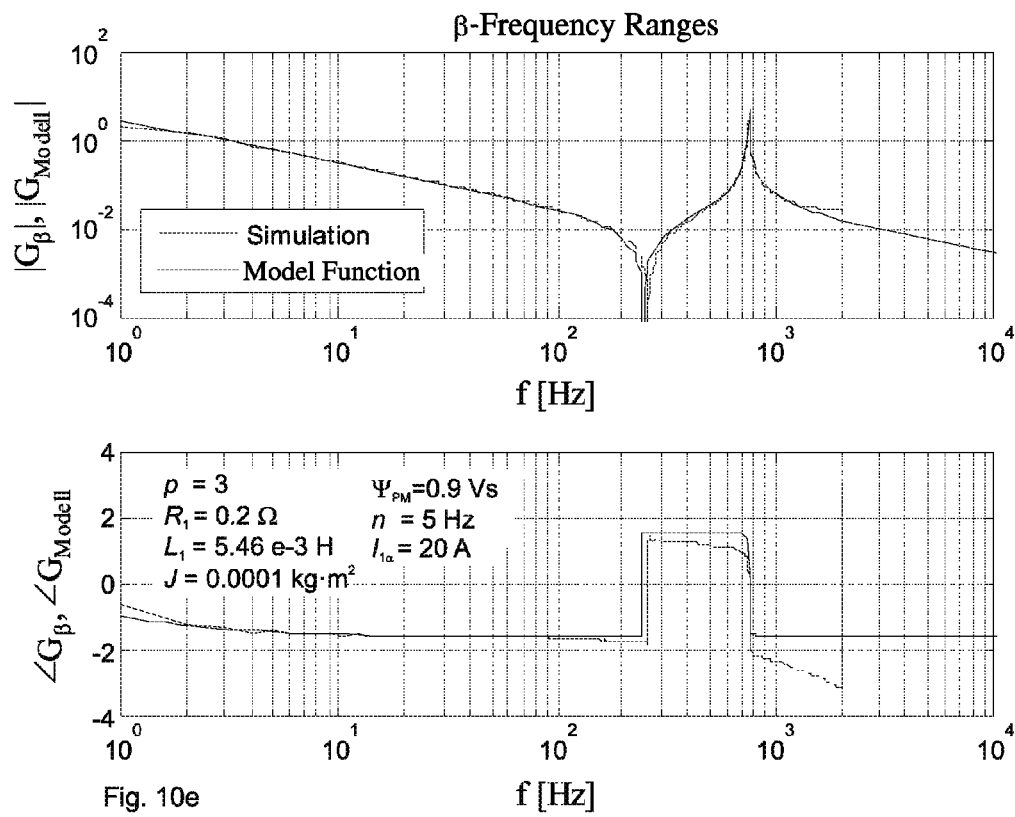
Figure 10F:
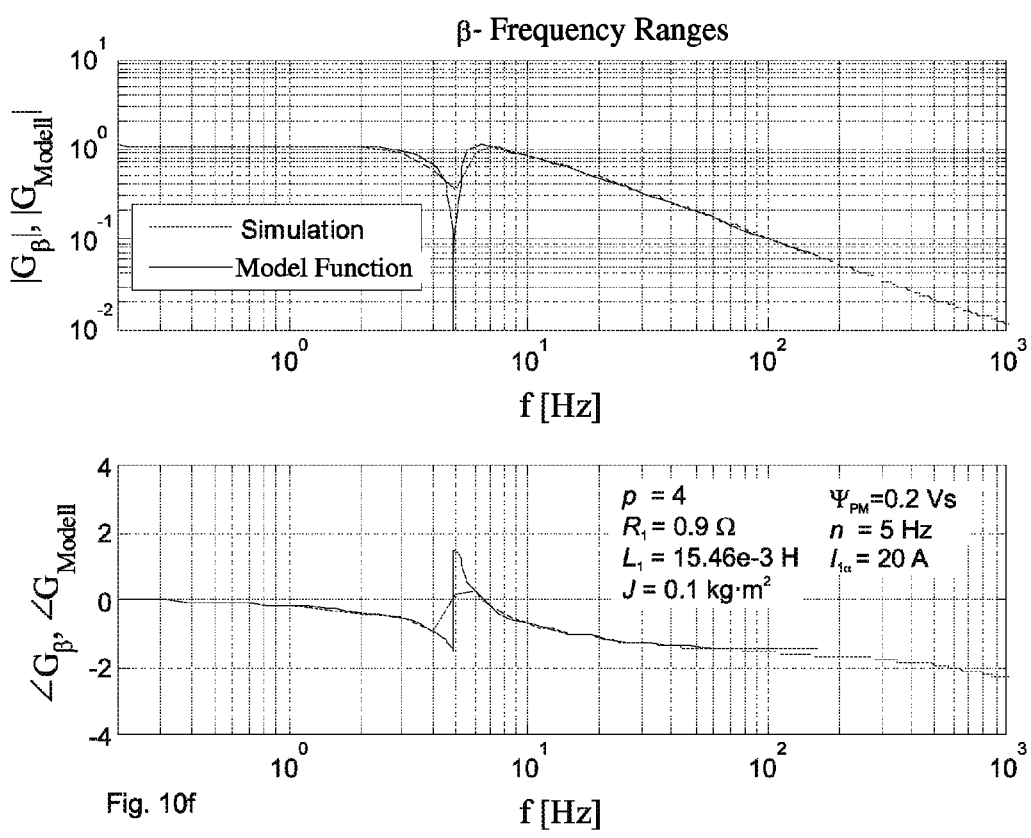
Figure 11:
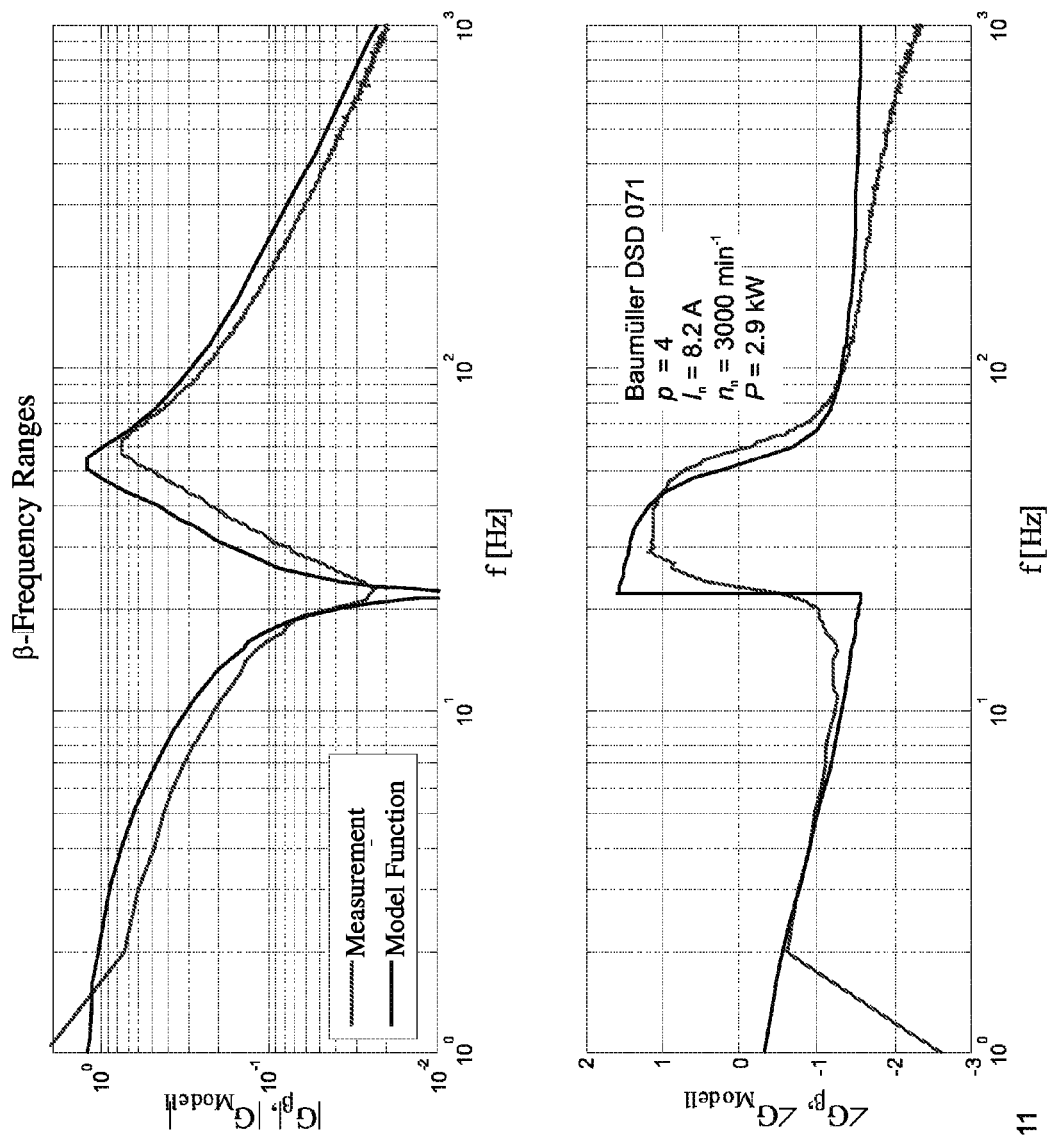

FIG. 3 schematically shows a construction of an asynchronous motor with squirrel-cage rotor;

FIG. 4 schematically shows a spring-mass basic design of a measuring method in accordance with the invention as well as an equivalent circuit of a synchronous motor;

FIG. 5 shows a first exemplary embodiment of a motor control device of the invention;

FIG. 6 shows an exemplary embodiment of a motor control apparatus in accordance with the invention;

FIG. 7 shows an operating sequence of an exemplary embodiment of the method in accordance with the invention;

FIG. 8 schematically shows an exemplary embodiment of a test signal feed into a mathematical model of a synchronous motor;

FIG. 9 schematically shows a representation of the elation between measuring signal current $I_{1q}$ and rotor position angle $\beta_k$;

FIG. 10 shows an amount phase course comparison of an admittance from simulated time range data and from a machine model when using a method in accordance with the invention on different synchronous machine types;

FIG. 11 shows an amount phase course of an admittance from measured time range data when using a method in accordance with the invention;

EMBODIMENTS OF THE INVENTION

Figure 1:
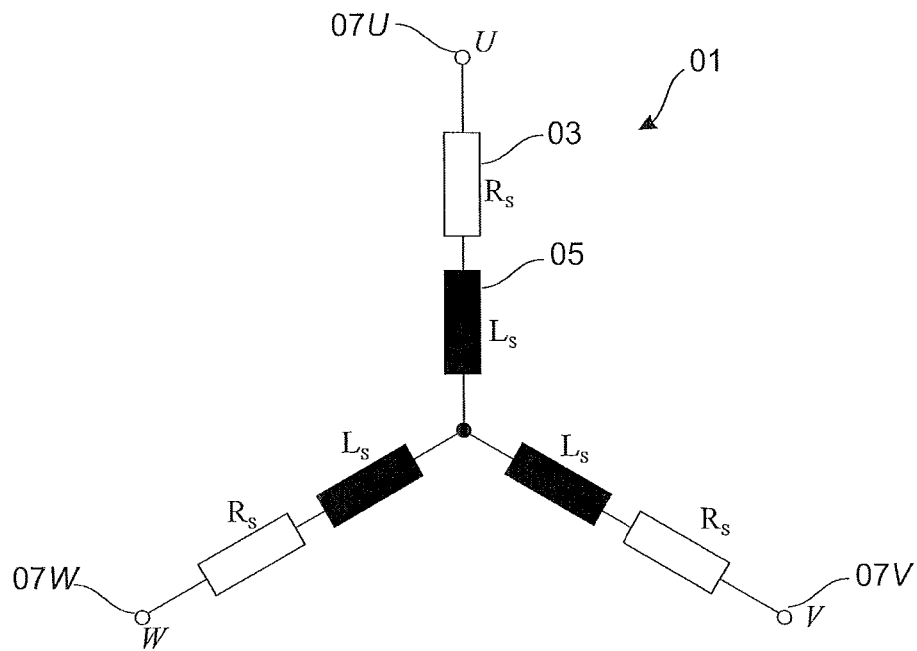
FIG. 1 shows an equivalent circuit of a stator coil of an asynchronous motor in a star connection.

In the figures the same or similar components are designated with the same reference numbers. In order to explain the invention FIG. 1 shows an equivalent circuit of the stator coil 01 3-phase motor. Each coil strand U, V and W comprises a coil resistor $R_s$ 03 and a coil inductivity $L_s$ 05. The three coil strands 07 are connected to each other at their first end and at their second end to the three phases U, V, W of the output of an inverter. The stator coil 01 integrates with the rotatably mounted rotor coil 11, that has a constant magnetizing in a d flux axial direction. The magnetic field of the rotor can be generated in a rotor winding by permanent magnets attached along the rotor circumference or by a direct current supplied via slip rings. The magnetic field of the rotor adheres to the rotating magnetic field of the stator and thus allows the rotor to rotate in the frequency of the magnetic field of the stator. The system of rotor coil 11 and stator coil 01 can be considered, instead of in a three-phase system U/V/W, in a stator two-coordinate system α/β or rotor two-coordinate system d/q, from which the equivalent circuit of the motor 09 shown in FIG. 4 can be derived.

Figure 2:
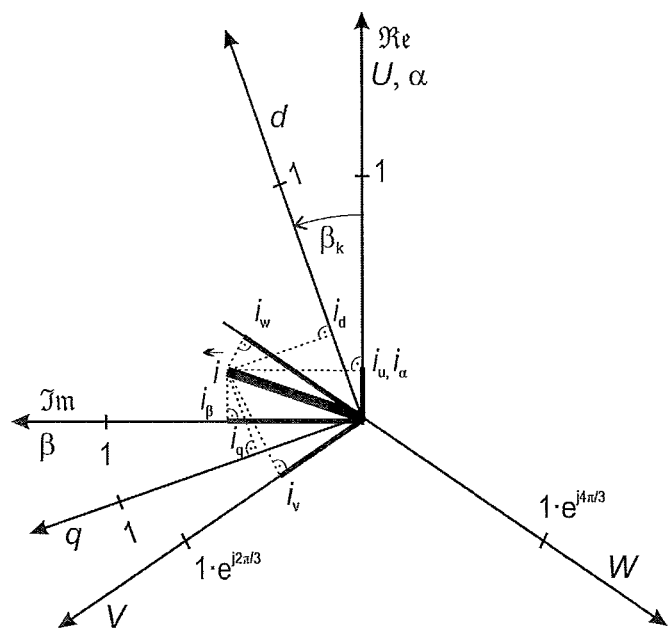
FIG. 2 shows a view of the connection between two-component- and three-phase coordinate systems.

To this end FIG. 2 at first shows the spatial association of the three-phase system U/V/W with three coordinate directions 1 (0°), $e^{j2\pi/3}$ (120° and $e^{j4\pi/3}$ (240°) compared to the α/β coordinate system of the complex plane with real part α and imaginary part β. Under the assumption of a total current I the latter can be divided relative to the three-phase system into three partial currents $I_U$, $I_V$ and $I_W$. In the same manner the current can be expressed by the partial currents in complex stator-fixed coordinate systems $I_\alpha$ and $I_\beta$. The relationship between and $I_\alpha$ and $I_\beta$ and $I_U$, $I_V$ and $I_W$ has already been indicated further above. When using the complex representation $I_\alpha$ and $I_\beta$, which indicate the stationary stator axis directions and the three phase currents $I_U$, $I_V$ and $I_W$, the above transformation specifications can be derived. The rotor has a rotating coordinate system d/q that comprises the rotor flux axis d and transverse flux axis q. The association between the rotating coordinates d/q and the stationary coordinates α/β can be established by the rotor angle of rotation $\beta_k$.

Figure 3A:
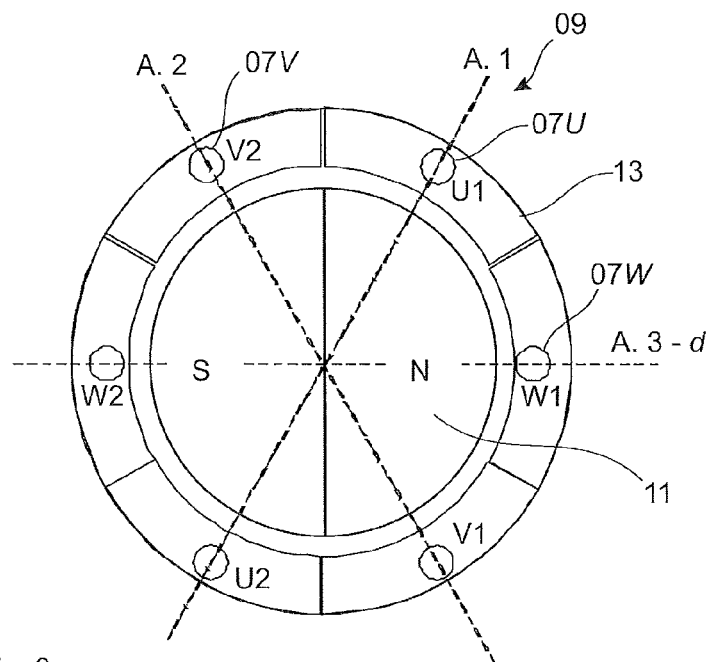
Figure 3B:
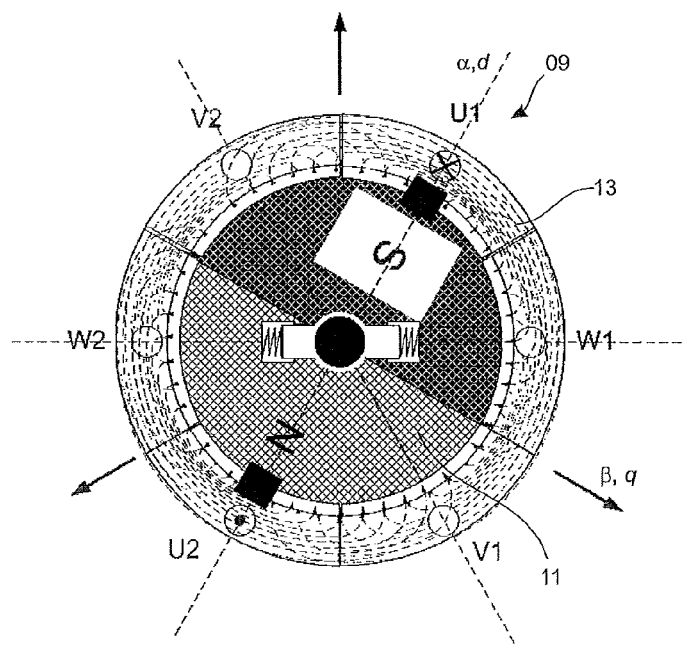

FIG. 3a schematically shows the construction of a three-phase asynchronous motor 09 (PMSM). This motor comprises in a simple embodiment a three-phase stator 13 with the coil strands U1, U2 (07-U), V1, V2 (07-V) and W1, W2 (07-W). The stationary stator coils define three coil axes A1, A2 and A3 that correspond to the three phase axes 1, $e^{j2\pi/3}$ and $e^{j4\pi/3}$. Rotor 11 comprises a permanently provided rotor, whereby the permanent magnetic field of the rotor 11 adheres to the electrically rotating magnetic field of the stator and thus brings about a torque, so that rotor 11 is put in rotation. FIG. 3b schematically shows a magnetomagnetic force $\psi_{PM}$ of rotor 11 and stator 13 with current coil 07-U provided with current, whereby the main stator α and the main direction of rotor magnetic flux d coincide.

FIGS. 4a and 4b schematically show the effect of a supplying of a test signal onto a permanent magnetic rotor 11. At first, in FIG. 4a the d axis is aligned with the α axis, for which a constant voltage $U_{1\alpha}$ is supplied, for example, with 10 V, in the αdirection into the stator so that a constant current supply $I_{1\alpha}$ results. As a consequence, the motor is oriented in the axis of flux (d axis), whereby the rotor shaft moves. The α axis now corresponds to the d axis and the β axis now corresponds to the q axis. The constant supply must be maintained during the entire identification procedure, i.e., also while the test signal is being supplied, as will be explained in the following. Thus, a spring-like action can be subsequently produced. In FIG. 4b the supplying of a test signal $U_{1\beta}$ as a PRB signal now takes place into the β axial direction parallel to the constant voltage supply. The stable position of the rotor is disturbed with the supplying of the PRBS into the β axial direction (=q axis for this instance) and a deflection and with it a torque occur. The constant current $I_{1\alpha}$ counteracts this and will attempt to draw the rotor back into the axis of flux.

Therefore, it is important that the amplitudes of the constant voltage and of the PRBS are in an appropriate relation. If the constant voltage in the α axis would be clearly too large, the effect would be like a mechanically stopped machine. The method described here is based on the fact that the machine can move out of the axis of flux and return back into it.

The spring-mass system formed in this manner is schematically shown in FIG. 4c. The constant current supply $I_{1\alpha}$ brings about the formation of a rotor-stator magnetic flux interlinkage that brings about a spring-like return of a deflection movement 75 of the mass system. The deflection movement is brought about by a current supply $I_{1\beta}$ in the β axis, that corresponds to the q axis.

FIG. 4d shows an equivalent circuit of a synchronous motor with the phase current $I_1$ and the phase voltage $U_1$. The voltage source $U_p$ describes the counter-induction effect of the magnetic field of the rotor in stator coil 01. The equivalent circuit according to FIG. 4d describes the electrical events in the stator coil 01 with $R_1$, $L_1$ 03, 05. The following admittance function can be derived on the basis of the equivalent circuit, with inclusion of the simplification of an alignment of the d to the α axis and use of the law of induction:

$$G_\beta(s) = \frac{I_{1\beta}(s)}{U_{1\beta}(s)} = \frac{s^2 J + K_T p I_{1\alpha}}{s^3 JL_1 + s^2 JR_1 + s(L_1 K_T p I_{1\alpha} + \Psi_{PM} K_T p) + R_1 K_T p I_{1\alpha}}$$

The present invention now has the problem of deriving the characteristic quantities J and $\psi_{PM}$ from the circuit of FIG. 4d. Starting from the knowledge of the equivalent circuit magnitudes $L_1$, $R_1$, that can be determined in advance from known or comparable identification parameters, when voltages $U_\beta$ are supplied, the current $I_\beta$ that develops can be measured and the transmission function Gβ determined in the frequency range. The unknown transmission parameters can be determined and the magnetomechanical characteristic quantities identified by a suitable parameter identification method. A description of the transient behavior is essential here, whereby a single analysis of the electrical behavior of the motor supplies the most precise knowledge possible about the equivalent circuit parameters.

FIG. 5 schematically shows a motor control circuit 16 in which the phases of a three-phase supply circuit 17 are converted by a three-phase bridge rectifier 19 into a direct voltage of a DC intermediate circuit 21. A buffer capacitor 23 is provided in the DE intermediate circuit 21 which capacitor smoothes the voltage and, for example, can make buffer energy available for a regulated emergency operation of the motor 09 in case of a power failure. An inverter 25 comprises three switching bridges in which power semiconductor switching elements 27 can switch the motor phases U/V/W opposite the direct voltage +DC and −DC of the intermediate circuit 21 in a coordinated manner and thus make available a PWM-modeled control voltage $U_u$, $U_v$, $U_w$ for the three-phase motor 09 in a speed-variable manner. Each power semiconductor switching element 27, that can comprise an IGBT transistor, a bipolar power transistor or the like is protected against overvoltage, in particular inductive reaction by the motor 09, by a free-wheeling diode 29. The phase voltages $U_u$, $U_v$, $U_w$ as well as phase currents $I_u$, $I_v$, $I_w$ are tapped off in the supply lines to three-phase motor 09 and supplied to a motor control device 35. The phase voltages do not have to be necessarily tapped off, since they can be given by the inverter 25, whereby it is assumed that the theoretical voltage value corresponds to the actual voltage value. The motor control device 35 comprises control lines in order to regulate the individual power semiconductor switching elements 27 in the correct phase depending on the desired speed behavior of the motor 09. In the case of a sensor-based regulation the motor control device 35 is furthermore coupled to position angle sensors and acceleration sensors, whereby temperature sensors can also be connected for monitoring the operating temperature of the motor 09. In the case of a field-oriented regulation without shaft encoder the motor control device 35 can carry out a speed-optimized control of the inverter switching components 27 solely by knowledge of the phase voltages 31 and measured phase currents 33. The regulating parameters of the motor control device 35 can be adjusted by knowledge of the electrical behavior of the motor 09, that can be described by the equivalent circuit shown in FIG. 4. To this end the motor control device 35 comprises an identification apparatus 39 like the one shown in FIG. 6.

FIG. 6 shows an exemplary embodiment of a motor control device 35 that comprises an identification apparatus 39 for the extraction of the characteristic quantities of the three-phase synchronous motor 09. The motor control device 35 comprises inputs for detecting the three phase currents $I_u$, $I_v$ and $I_w$ as well as detecting the three phase voltages $U_u$, $U_v$ and $U_w$ 31 of the three-phase motor 09, whereby a detection of only two phase voltages and phase currents is sufficient, since the third magnitude results according to Kirchhoff. Furthermore, the motor control device 35 comprises switching outputs 61 for outputting inverter switching signals for actuating the power semiconductor switching elements 27 of the inverter 25. The phase-correct generation of the inverter switching signals 61 takes place by a PWM (Pulse-Width Modulation) microcontroller that represents an inverter control apparatus 37 in order to carry out a regulation of speed and torque of the three-phase motor 09 without sensors or also sensor-supported. The identification apparatus 39 receives the phase voltages 31 and phase currents 33 and comprises a d/q transformation unit 41 that converts the phase voltages and phase currents into the partial voltage $U_d$, $U_q$ as well as partial currents $I_d$, $I_q$ of the complex two-coordinate system. The converted phase voltages and phase currents are supplied to a parameter identification unit 67 comprising on the one hand a Fourier transformation means 45 and on the other hand a parameter extraction means 47. A Fourier transformation is applied to the time range data of the phase voltages in phase currents so that this data can be present in the frequency range and the above-defined admittance transmission function $G_1$ can be formed. Instead of the admittance function, parameters of another transmission function, in particular impedance function or other logical electrical functional relations can be taken as base and their parameters determined. Starting from the courses of the transmission functions, the parameter identification unit 67 of the parameter extraction means 47, given knowledge of the admittance description function constituting the base, can extract the coefficients $a_0$, $a_2$, $b_0$, $b_1$ and $b_2$ to be identified from the curve courses. The system parameters, in particular the magnetic and mechanical characteristics quantities can be determined from this, and on their basis an optimization unit 49, that can perform a modulation of the motor as well as an optimizing of parameter adjustments of the generation of pulse width, can generate control parameters as well as filter parameters for the parameterizing, optimizing and monitoring of the inverter control device 37. The latter are forwarded to a PWM interface 53 and can therefore be transmitted to the inverter control device 37 in order to make possible an optimal regulation of the synchronous motor.

Test signals are supplied in the framework of the identification of characteristic quantities which signals can be generated by a test signal generation unit 51. In this exemplary embodiment a pseudo-noise binary signal (PRBS) is generated as test signal that makes the noise signal uniformly available as $U_\alpha/U_\beta$ by a U/V/W transformation unit 43 and is distributed onto the three phase voltages $U_U$, $U_V$ and $U_W$. This input signal is forwarded to the inverter control device 37, that accordingly controls the inverter 25 in such a manner that the motor 09 is supplied with current in accordance with the test signal.

FIG. 7 shows an exemplary embodiment of a program operating plan for carrying out a method in accordance with the invention. In step S1, at first the rotor is brought into a defined fixed position and standstill position at which the number of revolutions n=0. A constant supplying of current takes place here by feeding in a DC constant voltage in the α axial direction of the stator so that the d rotor axis is aligned along the α stator axis. The supplying of DC current is retained during the entire measuring procedure. In step S2 the supplying of a test signal is carried out as PRB signal in the β axis, that corresponds to the q axis of the rotor. A conversion is carried out from the α DC and β test signal into the phase voltages $U_U$, $U_V$ and $U_W$ and the motor is controlled therewith. The controlled voltage signals U(n) as well as the measured current values I(n) are scanned in the time range and converted by a Fourier transformation, in particular a DFT (Discrete Fourier Transformation) or FFT (Fast Fourier Transformation) using a Welch method into the frequency range, i.e. in this instance into the Laplace range so that the frequency range values U(k), I(k) result. In the Laplace range a transmission function of the admittance can be represented as $G(k)=I(k)/U(k)$, that forms the starting basis for the identification of the characteristic quantities. Given knowledge of the transmission function and knowledge about pole pair number p, constant current magnitude $I_{1\alpha}$ and the magnitude of the equivalent circuit parameters $L_1$, $R_1$, a parameter extraction, for example, building on the Levenberg-Marquardt algorithm, can be carried out by a system identification in order to determine the transmission coefficients $a_0$, $a_2$, $b_0$, $b_1$ and $b_2$ from the course of the curve. From this, the system parameters, in particular the values of the magnetic and mechanical characteristic quantities J and $\psi_{PM}$ can be derived and used for adjusting motor control parameters, for optimizing load changes or torque changes and for adjusting and designing filter parameters for a filtering of motor currents or motor voltages. A parameterization of the inverter control device 37 can be carried out with the knowledge of the magnetomechanical characteristic quantities, whereby a high dynamic of the motor behavior can be achieved by optimizing the regulatory behavior of the inverter control device 37 as the innermost regulator. Demanding regulating methods that go far beyond the possibilities of a conventional PI regulator of the synchronous motor can be achieved here since a precise knowledge of the electrical machine parameters is present. In particular, the regulator parameters for a state space regulator, dead-beat regulator or a model sequence regulation can be exactly adjusted.

FIG. 8 schematically shows the supplying of a test signal of a test signal generation unit 51 into a mathematical model of a three-phase synchronous motor 59 as a d/q model in the framework of a Matlab-Simulink simulation, whereby it is assumed that the d axis coincides with the α axis. The test signal generation unit 51 comprises an α/d test signal generation means 65 that generates a pseudo-noise binary signal that is made available in the cycle of an inverter control device 37 that regularly operates with a 16 kHz clock rate, i.e., 62.5 is clock time. Since the d/q motor model 59 can be modeled with quasi-analog signals, a scan raising unit 15 is interconnected that generates a quasi-continuous test signal from the roughly scanned 16 kHz test signal. This quasi-continuous test signal test signal is supplied into the d/q synchronous motor model 59 by a test signal amplifier 57 reinforces as motor voltage $U_{\beta/q}$. Parallel to this, an α test signal generation means 63 that is also comprised by the test signal generation unit 51 generates a DC direct voltage signal that is supplied as main magnetic flux axial voltage $U_d$ into the synchronous motor model 59. A simulation takes place here with Matlab-Simulink in order to carry out a mathematical verification of the method. Starting from the numeric simulation, the courses of the phase currents are recorded by a signal recording unit 69 which yields a resulting torque for a "oscillating" rotor movement in a narrow angular range.

FIG. 9 schematically shows the calculating instructions for determining the rotor position angle $\beta_k$ on the basis of the measuring current $I_{1q}$. The input magnitude of the block diagram is the torque-forming component of the stator current $I_{1q}$. This component is multiplied by the torque constant $K_T$ and yields the torque M=Jα. The rotary frequency $\Omega_K$ results from integration and division by the mass moment of inertia J, is re-integrated and multiplied by the pole pair number p, yielding the rotor position angle $\beta_k$. An integration can be replaced in the Laplace range by a division by s.

FIGS. 10a to 10f show amount- and phase courses of different synchronous motor types over a frequency range of 0-1 kHz of the admittance function G=Y, that was derived from the identified electrical system and from the exact machine model. It can be clearly recognized that the transmission functions G coincide almost identically with the particular exact machine models. Thus, a verification of the theoretical model can be demonstrated by numeric simulation. Starting from the scanned phase voltages and phase currents measured in the time range, and almost identical system characterization of the electrical behavior of the pre-phase motor 09 can be derived.

FIG. 11 shows an oscillogram course of the measured position signals during the self-identification using a method in accordance with the invention. The observed motor is a Baumüller DSD071 motor with a rated power of $P_N$=2.9 kW, rated speed of $n_N$=3000$^{-1}$, a pole pair number p=4 and a rated current $I_N$=8.2 A. the parameters for the model function were estimated in the present instance using the datasheet of the machine. A very good coordination can be recognized between measured frequency response model function.

The basic idea of the invention is based on a theoretical signal consideration of a three-phase electromotor in a two-coordinate space d/q, whereby evaluation signals present as motor currents can be transformed by asymmetrically supplying a broadband test signal, preferably a PRB signal, as motor voltages in the direction of the q main magnetic flux axis of the rotor into the frequency range, preferably by a Welch method. Building on this, transmission functions can be extracted from the supplied and measured signals and the basic magnetic and mechanical system description parameters can be evaluated by a parameter identification method, preferably a Levenberg-Marquardt algorithm. Given knowledge of the formula connection of the transmission function, the individual coefficients can be identified and therewith the mechanical and magnetic behavior of the motor characterized over a large frequency range. The invention places particular emphasis on the special supply type, the structure of the transmission function and the analysis specification in which a determination of the magnetomechanical characteristic quantities is made possible. The method illustrates the transient behavior of the motor over a large working frequency range and/or speed range and can be used to adjust, optimize and monitor the motor. In particular when used in a motor control device, a universal motor control device can be made available and can be adaptively used in the workshop or after the assembly of the motor when coupled to a mechanical output line for determining the motor behavior. This makes possible a determination of the characteristic quantities describing the machine which is rapid and protects the motor without special expense for hardware. The method can be retrofitted using software technology into existing motor control devices such as, for example, the Baumüller b_maXX motor controls and servoregulators, in particular the b_maXX 1000-5000 and opens up an automated identification and monitoring of the parameters

LIST OF REFERENCE NUMERALS 01 stator coils equivalent circuit of a synchronous motor
03 coil resistor
05 coil inductivity
07 U/V/W coil strand
09 asynchronous motor
11 rotor
13 stator
15 equivalent circuit of a stator coil of a synchronous motor
16 motor control circuit
17 AC supply mains
19 three-phase bridge rectifier
21 DC intermediate circuit
23 buffer capacitor
25 inverter
27 power semiconductor switching element
29 free-wheeling diode
31 phase voltage
33 phase current
35 motor control device
37 inverter control apparatus
39 identification apparatus
41 α/β transformation unit
43 U/V/W transformation unit
45 Fourier transformation means
47 parameter determination means
49 optimization unit
51 test signal generation unit
53 inverter control interface unit
55 scan rate raising unit
57 test signal amplifier
59 α/β asynchronous model
61 inverter switching signals
63 α test signal generation means
65 β test signal generation means
67 parameter identification unit
69 signal recording unit
71 multiplicator
73 integrator
75 deflection movement
77 spring-mass system
79 magnetomechanical magnitudes inertia moment J & permanent magnetic flux $\psi_{PM}$

The invention claimed is:

1. A method for the identification of magnetomechanical characteristic quantities without a shaft encoder, the quantities including the mass moment of inertia J and the permanent magnetic flux $\Psi_{PM}$ between the rotor (11) and the stator (13) of a three-phase synchronous motor (09),
comprising at least the steps:
applying a constant voltage $U_{1d}$ in d-direction of axial flux of the rotor (11) by impressing a direct current $I_d=I_{DC}$ to bring about an alignment of the rotor (11) opposite the stator (13), whereby no torque is exerted on the rotor (11) after the rotor (11) assumes a standstill position;
applying a test signal voltage $U_{1q}$ in q-transverse axial direction of the rotor (11), whereby the d-direction of axial flux remains with DC current;
detecting a measurement signal current $I_{1q}$ of the q-transverse axial direction;
identifying magnetomechanical characteristic quantities of the synchronous motor (09) based on the test signal voltage $U_{1q}$ and on the measurement signal current $I_{1q}$;
whereby the applying of a test signal voltage into the synchronous motor (09) takes place in such a manner that the rotor (11) can execute deflection movements (75) with pre-definable maximal amplitudes based on the applying of test signals, so that no complete rotation of the rotor (11) can take place and the rotor (11) remains aligned in a definable angular range relative to the stator (13).

2. The method according to claim 1,
characterized in that
given knowledge of the position of the d/q rotor axis directions opposite the α/β stator axial directions, an appropriate $U_{1\alpha}$, $U_{1\beta}$ supply takes place, so that a constant stator magnetic field can be carried out in the d direction of axial flux and a test signal can be carried out in the q direction of axial flux.

3. The method according to claim 2,
characterized in that
supplying a constant voltage $U_{1\alpha}$ in the α axial direction of the stator (13) brings about an alignment of the d flux axis of the rotor (11) relative to the α axis of the stator (13) by impressing a direct current $I_{1\alpha}=I_{DC}$, and
applying a test signal voltage $U_{1\beta}$ in the β axial direction, whereby the α axial direction remains supplied with DC current so that a measurement signal current that measures $I_{1\beta}$ of the β axial direction can be detected.

4. The method according to claim 3,
characterized in that
the ratio of constant voltage $U_{1d}$ to test signal voltage $U_{1q}$ is selected in an optimal manner for achieving maximal amplitudes of the deflection movement (75) at a height such that magnetomechanical characteristic quantities of an adjustable spring-mass system (77) are determined with a pre-determinable accuracy.

5. The method according to claim 3, characterized in that
further characteristic quantities of equivalent circuit characteristic quantities $L_1$, $R_1$ (03, 05, 15) as well as mechanical structural magnitudes of pole pair number p or electrical measuring magnitudes $I_{1\alpha}$, $I_{1\beta}$, or $I_{1\alpha}=I_{DC}$ of the synchronous motor (09) are taken into account or also identified.

6. The method according to claim 3, characterized in that
the test signal is a pseudo-noise binary signal.

7. The method according to claim 3, characterized in that
the identification of the magnetomechanical characteristic quantities comprises a Fourier transformation of time-discrete signals according to a Welch method.

8. The method according to claim 3 characterized in that
the identification of the magnetomechanical characteristic quantities comprises a transmission function-parameter determination according to a Levenberg-Marquardt algorithm.

9. The method according to claim 3 characterized in that
the identified magnetomechanical characteristic quantities are used in an adjustment or optimization of inverter control parameters or for motor monitoring.

10. An identification apparatus (39) for the identification of magnetomechanical characteristic quantities without shaft encoder of a three-phase synchronous motor (09), the apparatus comprising an inverter interface unit (39) that is connected to an inverter control apparatus (37) for a controlling communication and for determining rotor standstill, characterized in that
the identification apparatus (39) furthermore comprises
a test signal generation apparatus (51) for generating a d/q test signal, the test signal comprising a direct current $I_{1d}=I_{DC}$ to brine about an alignment of the rotor (11) opposite the stator (13), whereby no torque is exerted on the rotor (11);
a U/V/W transformation unit (43) for transformation of the d/q test signal into a U/V/W control test signal,
a d/q transformation unit (41) for transformation of detected U/V/W measurement signal currents into d/q measurement signal currents and
a parameter identification unit (67) for identification of the magnetomechanical characteristic quantities under the assumption of a standstill position of the rotor (11).

11. The apparatus according to claim 10, characterized in that
the parameter identification unit (67) comprises a Fourier transformation means (45) for the Fourier transformation of discontinuous d/q scanning signal values according to the Welch method and comprises a parameter determination means (47).

12. The apparatus according to claim 10, characterized in that
furthermore the apparatus comprises, a monitoring and optimization unit (49) that is set up to determine, optimize or monitor control parameters of an inverter control apparatus (37) on the basis of the identified magnetomechanical characteristic quantities.

13. A motor control device (35) for controlling a three-phase synchronous motor (09) without a shaft encoder, and comprising
(a) an identification apparatus (39) for the shaft-encoder-less identification of magnetomechanical characteristic quantities of a three-phase synchronous motor (09), the identification apparatus (39) furthermore comprising a test signal generation apparatus (51) for generating a d/q test signal, the test signal comprising
a direct current $I_{1d}=I_{DC}$ to bring about an alignment of the rotor (11) opposite the stator (13), whereby no torque is exerted on the rotor (11);
a U/V/W transformation unit (43) for transformation of the d/q test signal into a U/V/W control test signal,
a d/q transformation unit (41) for transformation of detected U/V/W measurement signal currents into d/q measurement signal currents and
a parameter identification unit (67) for identification of the magnetomechanical characteristic quantities under the assumption of a standstill position of the rotor (11) and
(b) an inverter interface unit (39) that is connected to an inverter control apparatus (37) for a controlling communication and for determining rotor standstill,
whereby the identified characteristic quantities are used for the determination, optimization and monitoring of the motor (09) or of the motor control.

14. The device according to claim 13, characterized in that
the device is arranged in such a manner that an automated identification of the magnetomechanical characteristic quantities is carried out at least during the first startup, whereby an error signal is initiated upon a demonstrable deviation of the magnetomechanical characteristic quantities from previously determined, stored or model-related characteristic quantities.

15. The use of a method according to claim 1 for the determination, optimization and monitoring of motor regulator parameters for the control of electrical drives.

* * * * *

UNITED STATES PATENT AND TRADEMARK OFFICE
CERTIFICATE OF CORRECTION

PATENT NO.       : 8,587,250 B2
APPLICATION NO.  : 13/205712
DATED            : November 19, 2013
INVENTOR(S)      : Sebastian Villwock and Heiko Zatocil It is certified that error appears in the above-identified patent and that said Letters Patent is hereby corrected as shown below:

In the Claims

In Claim 10, column 23, line 42, correct "brine" to "bring"

Signed and Sealed this
Seventh Day of January, 2014

Margaret A. Focarino
*Commissioner for Patents of the United States Patent and Trademark Office*